(12) United States Patent
Ikemoto

(10) Patent No.: US 11,392,784 B2
(45) Date of Patent: *Jul. 19, 2022

(54) RFID SYSTEM

(71) Applicant: Murata Manufacturing Co., Ltd., Nagaokakyo (JP)

(72) Inventor: Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 389 days.

This patent is subject to a terminal disclaimer.

(21) Appl. No.: 15/987,991

(22) Filed: May 24, 2018

(65) Prior Publication Data

US 2018/0276429 A1    Sep. 27, 2018

Related U.S. Application Data

(63) Continuation of application No. 15/340,035, filed on Nov. 1, 2016, now Pat. No. 10,007,817, which is a
(Continued)

(30) Foreign Application Priority Data

Mar. 24, 2010 (JP) ................................. 2010-068247

(51) Int. Cl.
*H04Q 5/22* (2006.01)
*G06K 7/10* (2006.01)
(Continued)

(52) U.S. Cl.
CPC ....... *G06K 7/10346* (2013.01); *H01Q 1/2208* (2013.01); *H01Q 1/40* (2013.01);
(Continued)

(58) Field of Classification Search
CPC .... G06K 7/10346; H01Q 1/2208; H01Q 1/40; H01Q 7/00; H01Q 11/08; H04B 5/0062; H04B 5/0081; H05K 999/99
See application file for complete search history.

(56) References Cited

U.S. PATENT DOCUMENTS 5,448,110 A * 9/1995 Tuttle ................ H01L 23/49855
257/723
5,608,417 A * 3/1997 de Vall ............. G06K 19/07784
343/895
(Continued)

OTHER PUBLICATIONS

Ikemoto, "RFID System", U.S. Appl. No. 15/340,035, filed Nov. 1, 2016.

*Primary Examiner* — Quang Pham
(74) *Attorney, Agent, or Firm* — Keating & Bennett, LLP

(57) ABSTRACT

An RFID system includes an antenna of a reader/writer and an antenna of an RFID tag. Transmission and reception of a high-frequency signal of a UHF band is performed between the antenna of the reader/writer and the antenna of the RFID tag that are arranged so as to be adjacent to each other. A loop antenna including a loop conductor is used as the antenna of the reader/writer, and coil antennas including a plurality of laminated coil conductors are used as the antenna of an RFID tag. In addition, the conductor width of the loop conductor in the loop antenna is greater than the conductor widths of the coil conductors in the coil antennas.

9 Claims, 14 Drawing Sheets

Related U.S. Application Data continuation of application No. 13/457,525, filed on Apr. 27, 2012, now Pat. No. 9,727,765, which is a continuation of application No. PCT/JP2011/055344, filed on Mar. 8, 2011.

(51) Int. Cl.
*H01Q 1/22* (2006.01)
*H01Q 1/40* (2006.01)
*H01Q 7/00* (2006.01)
*H01Q 11/08* (2006.01)
*H04B 5/00* (2006.01)

(52) U.S. Cl.
CPC .............. *H01Q 7/00* (2013.01); *H01Q 11/08* (2013.01); *H04B 5/0062* (2013.01); *H04B 5/0081* (2013.01); *H05K 999/99* (2013.01)

(56) References Cited

U.S. PATENT DOCUMENTS

| | | | | |
|---|---|---|---|---|
| 6,107,920 | A * | 8/2000 | Eberhardt | G06K 19/07743 257/673 |
| 6,353,420 | B1 * | 3/2002 | Chung | G06K 19/07747 235/441 |
| 6,900,536 | B1 * | 5/2005 | Derbenwick | H05K 1/186 257/737 |
| 7,286,053 | B1 * | 10/2007 | Gudeman | G08B 13/2448 340/572.1 |
| 7,432,816 | B1 * | 10/2008 | Ku | H01Q 1/40 361/764 |
| 7,500,610 | B1 * | 3/2009 | Hadley | G06K 19/07718 340/572.1 |
| 7,586,415 | B2 * | 9/2009 | Lee | H01Q 9/0407 340/572.7 |
| RE42,773 | E * | 10/2011 | Tuttle | H04L 29/1232 235/487 |
| 8,400,365 | B2 * | 3/2013 | Kato | H01Q 7/00 343/702 |
| 8,676,117 | B2 * | 3/2014 | Dokai | H01L 23/642 455/333 |
| 8,810,456 | B2 * | 8/2014 | Kato | H01Q 9/285 343/895 |
| 8,960,558 | B1 * | 2/2015 | MacKenzie | H01L 21/6835 235/492 |
| 9,236,651 | B2 * | 1/2016 | Nakano | H01Q 1/521 |
| 9,436,902 | B1 * | 9/2016 | Koepp | G06K 19/07754 |
| 10,248,902 | B1 * | 4/2019 | Finn | G06K 19/07722 |
| 10,432,033 | B2 * | 10/2019 | Peralta | H01F 27/36 |
| 2002/0163434 | A1 * | 11/2002 | Burke | G08B 13/242 340/572.1 |
| 2002/0171528 | A1 * | 11/2002 | Uchibori | G08B 13/242 336/200 |
| 2003/0016133 | A1 * | 1/2003 | Egbert | G06K 19/0726 340/572.5 |
| 2004/0046663 | A1 * | 3/2004 | Jesser | G06K 19/07792 340/572.1 |
| 2004/0075616 | A1 * | 4/2004 | Endo | G06K 19/07771 343/895 |
| 2005/0024287 | A1 * | 2/2005 | Jo | G06K 19/07786 343/822 |
| 2005/0024290 | A1 * | 2/2005 | Aisenbrey | G08B 21/0297 343/873 |
| 2005/0035924 | A1 * | 2/2005 | Liu | G06K 19/07752 343/895 |
| 2005/0093678 | A1 * | 5/2005 | Forster | G06K 19/07796 343/700 MS |
| 2005/0173532 | A1 * | 8/2005 | Hasebe | H01Q 7/00 235/492 |
| 2005/0276028 | A1 * | 12/2005 | Yeo | G08B 13/2417 361/783 |
| 2006/0009251 | A1 * | 1/2006 | Noda | H01Q 7/00 455/550.1 |
| 2006/0017571 | A1 * | 1/2006 | Arnold | G08B 13/2417 235/492 |
| 2006/0017623 | A1 * | 1/2006 | Luch | H01Q 9/27 430/311 |
| 2006/0032926 | A1 * | 2/2006 | Baba | H01Q 1/2216 235/492 |
| 2006/0055541 | A1 * | 3/2006 | Bleckmann | G06K 19/07749 343/893 |
| 2007/0001921 | A1 * | 1/2007 | Takahashi | H01Q 7/06 343/788 |
| 2007/0007342 | A1 * | 1/2007 | Cleeves | H01L 28/60 340/572.1 |
| 2007/0020969 | A1 * | 1/2007 | Yungers | G06K 7/10316 439/77 |
| 2007/0046544 | A1 * | 3/2007 | Murofushi | H01Q 9/0407 343/700 MS |
| 2007/0090955 | A1 * | 4/2007 | Cote | G06K 19/07718 340/572.5 |
| 2007/0095913 | A1 * | 5/2007 | Takahashi | H01Q 7/00 235/492 |
| 2007/0095922 | A1 * | 5/2007 | Kawai | H01Q 7/00 235/492 |
| 2007/0095925 | A1 * | 5/2007 | Zhu | G06K 19/07767 235/492 |
| 2007/0095926 | A1 * | 5/2007 | Zhu | G06K 19/07767 235/492 |
| 2007/0103316 | A1 * | 5/2007 | Tuttle | G01S 13/758 340/572.8 |
| 2007/0146138 | A1 * | 6/2007 | Phipps | G06K 7/0008 340/572.7 |
| 2007/0159339 | A1 * | 7/2007 | Matsuura | G06K 19/07749 340/572.7 |
| 2007/0169336 | A1 * | 7/2007 | Luch | G06K 19/07783 29/601 |
| 2007/0182641 | A1 * | 8/2007 | Luch | H01Q 23/00 343/700 MS |
| 2007/0187820 | A1 * | 8/2007 | Takano | H01L 51/5203 257/E27.113 |
| 2007/0238245 | A1 * | 10/2007 | Cote | G06K 19/07718 438/243 |
| 2007/0252703 | A1 * | 11/2007 | Kato | G06K 19/07773 340/572.7 |
| 2007/0296555 | A1 * | 12/2007 | Kanno | H01Q 1/2225 257/E23.179 |
| 2008/0023810 | A1 * | 1/2008 | Yamazaki | G06K 19/07728 257/679 |
| 2008/0042266 | A1 * | 2/2008 | Kagaya | G06K 19/07771 257/E23.125 |
| 2008/0048863 | A1 * | 2/2008 | Copeland | H01Q 1/2225 340/572.1 |
| 2008/0055045 | A1 * | 3/2008 | Swan | G06K 19/07771 340/10.1 |
| 2008/0150719 | A1 * | 6/2008 | Cote | G06K 19/07779 340/572.1 |
| 2008/0179404 | A1 * | 7/2008 | Finn | H01Q 1/40 438/759 |
| 2009/0009332 | A1 * | 1/2009 | Nunez | A01K 11/007 340/572.1 |
| 2009/0095818 | A1 * | 4/2009 | Smith | G06K 19/0775 29/829 |
| 2009/0108996 | A1 * | 4/2009 | Day | G08B 13/2417 438/26 |
| 2009/0128436 | A1 * | 5/2009 | Guo | H01Q 1/38 343/772 |
| 2009/0146821 | A1 * | 6/2009 | Kato | H01Q 1/2225 340/572.7 |
| 2009/0159657 | A1 * | 6/2009 | Chen | G06K 19/07749 235/375 |
| 2009/0160719 | A1 * | 6/2009 | Kato | H01Q 1/2225 343/788 |
| 2009/0173443 | A1 * | 7/2009 | Kozlak | G06K 19/0723 156/303.1 |
| 2009/0179810 | A1 * | 7/2009 | Kato | H04B 5/0012 343/785 |
| 2009/0201155 | A1 * | 8/2009 | Arguin | G08B 13/2411 340/572.1 |

(56) References Cited

U.S. PATENT DOCUMENTS

| | | | | |
|---|---|---|---|---|
| 2010/0001079 A1* | 1/2010 | Martin | G08B 13/2414 | 235/492 |
| 2010/0007499 A1* | 1/2010 | Arguin | G08B 13/242 | 340/572.1 |
| 2010/0007567 A1* | 1/2010 | Hilgers | H01Q 9/285 | 343/741 |
| 2010/0090015 A1* | 4/2010 | Sakama | H01Q 23/00 | 235/492 |
| 2010/0123582 A1* | 5/2010 | Smith | G08B 13/242 | 29/25.42 |
| 2010/0156723 A1* | 6/2010 | Luch | H01Q 1/2225 | 343/700 MS |
| 2010/0156735 A1* | 6/2010 | Nakamura | H01Q 1/38 | 343/788 |
| 2010/0182211 A1* | 7/2010 | Peters | G06K 19/07756 | 343/730 |
| 2010/0308968 A1* | 12/2010 | Tamm | G06K 19/07783 | 264/400 |
| 2010/0314455 A1* | 12/2010 | Kato | H01Q 21/29 | 235/492 |
| 2011/0005821 A1* | 1/2011 | Marttila | G08B 13/244 | 174/258 |
| 2011/0018667 A1* | 1/2011 | Jaeger | B60C 23/043 | 336/120 |
| 2011/0024509 A1* | 2/2011 | Mingle | G01V 15/00 | 235/492 |
| 2011/0036912 A1* | 2/2011 | Guo | G06K 19/07749 | 343/866 |
| 2011/0062244 A1* | 3/2011 | Kato | H01Q 7/00 | 235/492 |
| 2011/0073661 A1* | 3/2011 | Forster | G06K 19/07749 | 235/492 |
| 2011/0090058 A1* | 4/2011 | Ikemoto | H01Q 5/35 | 340/10.1 |
| 2011/0124299 A1* | 5/2011 | Koujima | H01F 1/344 | 307/104 |
| 2012/0038445 A1* | 2/2012 | Finn | G06K 19/07783 | 336/105 |
| 2012/0074233 A1* | 3/2012 | Finn | G06K 19/07756 | 235/492 |
| 2012/0086556 A1* | 4/2012 | Ikemoto | H01Q 7/00 | 235/492 |
| 2012/0091210 A1* | 4/2012 | Koujima | H01Q 1/04 | 235/492 |
| 2012/0091821 A1* | 4/2012 | Kato | H01Q 1/2216 | 307/104 |
| 2012/0111950 A1* | 5/2012 | Worrall | G06K 19/07786 | 235/488 |
| 2012/0182128 A1* | 7/2012 | Ikemoto | H01Q 9/16 | 340/10.1 |
| 2012/0206239 A1* | 8/2012 | Ikemoto | H01Q 7/00 | 340/10.1 |
| 2012/0223149 A1* | 9/2012 | Kato | H01Q 1/38 | 235/492 |
| 2012/0235870 A1* | 9/2012 | Forster | H01Q 13/10 | 29/601 |
| 2012/0305657 A1* | 12/2012 | Kato | H05K 1/0243 | 235/492 |
| 2012/0325915 A1* | 12/2012 | Kato | H04B 5/0081 | 235/492 |
| 2012/0325916 A1* | 12/2012 | Tsubaki | H03H 7/425 | 235/492 |
| 2012/0326931 A1* | 12/2012 | Murayama | G06K 19/07749 | 343/866 |
| 2013/0020394 A1* | 1/2013 | Koujima | H01Q 7/00 | 343/788 |
| 2013/0069785 A1* | 3/2013 | Subramanian | G06K 19/067 | 216/13 |
| 2013/0126622 A1* | 5/2013 | Finn | H05K 3/103 | 29/601 |
| 2013/0127573 A1* | 5/2013 | Nakano | H01Q 19/00 | 336/115 |
| 2013/0134225 A1* | 5/2013 | Teshima | H01Q 1/2225 | 235/492 |
| 2013/0135172 A1* | 5/2013 | Ito | G06K 19/07794 | 343/867 |
| 2013/0140370 A1* | 6/2013 | Finn | G06K 19/07769 | 29/601 |
| 2013/0147675 A1* | 6/2013 | Kato | H01Q 1/40 | 343/788 |
| 2013/0176184 A1* | 7/2013 | Dokai | H01Q 9/285 | 343/749 |
| 2013/0181876 A1* | 7/2013 | Miura | H01Q 1/242 | 343/788 |
| 2013/0186961 A1* | 7/2013 | Kimura | G06K 19/07786 | 235/492 |
| 2013/0200162 A1* | 8/2013 | Dokai | G06K 19/07786 | 235/492 |
| 2013/0206845 A1* | 8/2013 | Koujima | G06K 19/07781 | 336/170 |
| 2013/0229319 A1* | 9/2013 | Miura | H01Q 7/06 | 343/788 |
| 2013/0264390 A1* | 10/2013 | Frey | C23F 1/02 | 235/492 |
| 2013/0307746 A1* | 11/2013 | Nakano | H01Q 1/2225 | 343/866 |
| 2013/0335281 A1* | 12/2013 | Dokai | G06K 19/0726 | 343/748 |
| 2013/0341415 A1* | 12/2013 | Dokai | G06K 19/07777 | 235/492 |
| 2014/0027520 A1* | 1/2014 | Kato | H01Q 1/2225 | 235/492 |
| 2014/0035793 A1* | 2/2014 | Kato | H01Q 7/06 | 343/867 |
| 2014/0043196 A1* | 2/2014 | Gouchi | H01Q 7/08 | 343/788 |
| 2014/0062827 A1* | 3/2014 | Kato | H01Q 1/2225 | 343/856 |
| 2014/0078014 A1* | 3/2014 | Kato | H04B 1/0458 | 343/860 |
| 2014/0091909 A1* | 4/2014 | Smith | H01G 4/38 | 29/25.42 |
| 2014/0104133 A1* | 4/2014 | Finn | H05K 3/103 | 343/866 |
| 2014/0145883 A1* | 5/2014 | Baks | H01L 23/66 | 343/700 MS |
| 2014/0145906 A1* | 5/2014 | Kato | H01Q 7/00 | 343/867 |
| 2014/0151455 A1* | 6/2014 | Li | G06K 19/07771 | 438/98 |
| 2014/0176382 A1* | 6/2014 | Nakano | G06K 7/10178 | 343/788 |
| 2014/0176383 A1* | 6/2014 | Yosui | H01Q 7/08 | 343/788 |
| 2014/0176384 A1* | 6/2014 | Yosui | H01Q 1/36 | 343/788 |
| 2014/0184462 A1* | 7/2014 | Yosui | H01Q 7/06 | 343/788 |
| 2014/0198006 A1* | 7/2014 | Nakano | H01Q 7/06 | 343/788 |
| 2014/0198011 A1* | 7/2014 | Tsubaki | H01Q 7/00 | 343/867 |
| 2014/0203976 A1* | 7/2014 | Yosui | H01Q 7/06 | 343/788 |
| 2014/0203981 A1* | 7/2014 | Nakano | G06K 19/07794 | 343/749 |
| 2014/0203985 A1* | 7/2014 | Tsubaki | H01Q 19/00 | 343/788 |
| 2014/0203986 A1* | 7/2014 | Kato | H01Q 23/00 | 343/788 |
| 2014/0203991 A1* | 7/2014 | Yosui | H01Q 1/2216 | 343/866 |
| 2014/0203992 A1* | 7/2014 | Nakano | G06K 7/10009 | 343/867 |
| 2014/0217183 A1* | 8/2014 | Yosui | G06K 7/10178 | 343/702 |
| 2014/0224887 A1* | 8/2014 | Endou | H01Q 9/26 | 235/492 |

(56) References Cited

U.S. PATENT DOCUMENTS

| | | | |
|---|---|---|---|
| 2014/0253404 A1* | 9/2014 | Ikemoto | H01Q 1/40 343/788 |
| 2014/0284386 A1* | 9/2014 | Finn | H01Q 7/06 343/866 |
| 2014/0292611 A1* | 10/2014 | Kubo | G06K 19/07794 343/867 |
| 2014/0319230 A1* | 10/2014 | Murayama | G06K 19/07784 235/492 |
| 2015/0021402 A1* | 1/2015 | Finn | H01Q 7/00 235/492 |
| 2015/0035718 A1* | 2/2015 | Gouchi | H01Q 7/00 343/788 |
| 2015/0097040 A1* | 4/2015 | Rampetzreiter | G06K 19/07794 235/492 |
| 2015/0136858 A1* | 5/2015 | Finn | B23K 26/361 235/492 |
| 2015/0188228 A1* | 7/2015 | Yosui | H01Q 23/00 343/866 |
| 2015/0235122 A1* | 8/2015 | Finn | H01F 27/363 235/492 |
| 2015/0236418 A1* | 8/2015 | Ito | H01Q 1/38 343/788 |
| 2015/0269477 A1* | 9/2015 | Finn | G06K 19/07747 235/492 |
| 2015/0280322 A1* | 10/2015 | Saito | H02J 50/10 343/788 |
| 2015/0325927 A1* | 11/2015 | Ito | H01Q 7/00 343/860 |
| 2016/0086821 A1* | 3/2016 | West | G08B 13/2437 438/25 |
| 2016/0110639 A1* | 4/2016 | Finn | G06K 19/07756 235/492 |
| 2016/0118711 A1* | 4/2016 | Finn | G06K 19/07794 343/867 |
| 2016/0181695 A1* | 6/2016 | Mukherjee | H01Q 1/2216 343/866 |
| 2016/0190692 A1* | 6/2016 | Qin | H01Q 7/00 343/870 |
| 2016/0328640 A1* | 11/2016 | Kato | H01Q 1/2283 |
| 2016/0350638 A1* | 12/2016 | Kato | G06K 19/07 |
| 2016/0351514 A1* | 12/2016 | Ikeda | H01L 23/49822 |
| 2016/0352016 A1* | 12/2016 | Ito | H01F 17/0033 |
| 2016/0353619 A1* | 12/2016 | Kato | G09F 3/00 |
| 2016/0365644 A1* | 12/2016 | Finn | B23K 26/361 |
| 2017/0005391 A1* | 1/2017 | Tenno | H04B 5/0062 |
| 2017/0012339 A1* | 1/2017 | Ito | G06K 19/077 |
| 2017/0012355 A1* | 1/2017 | Pachler | H04B 5/0081 |
| 2017/0017868 A1* | 1/2017 | Komaki | G06K 19/077 |
| 2017/0017871 A1* | 1/2017 | Finn | G06K 19/07794 |
| 2017/0017872 A1* | 1/2017 | Kato | G06K 19/07722 |
| 2017/0025758 A1* | 1/2017 | Tomonari | H01Q 1/243 |
| 2017/0026089 A1* | 1/2017 | Kato | H01L 21/565 |
| 2017/0040105 A1* | 2/2017 | Peralta | H01F 38/14 |
| 2017/0040107 A1* | 2/2017 | Peralta | H01F 41/041 |
| 2017/0040665 A1* | 2/2017 | Takashima | H01Q 1/2291 |
| 2017/0040691 A1* | 2/2017 | Singh | H01F 38/14 |
| 2017/0047634 A1* | 2/2017 | Kato | H01Q 7/00 |
| 2017/0054213 A1* | 2/2017 | Singh | H04B 5/0081 |
| 2017/0069585 A1* | 3/2017 | Kato | H01L 23/3731 |
| 2017/0077589 A1* | 3/2017 | Finn | H01Q 1/2225 |
| 2017/0083804 A1* | 3/2017 | Kato | H01Q 1/2225 |
| 2017/0194711 A1* | 7/2017 | Nakano | H01Q 1/2216 |
| 2017/0214139 A1* | 7/2017 | Tenno | H01Q 11/08 |
| 2017/0229778 A1* | 8/2017 | Tenno | H01Q 1/2275 |
| 2017/0270401 A1* | 9/2017 | Kato | G06K 19/07758 |
| 2017/0271757 A1* | 9/2017 | Kato | G06K 19/07794 |
| 2017/0331190 A1* | 11/2017 | Tenno | H01Q 7/00 |
| 2017/0344872 A1* | 11/2017 | Komaki | G06K 19/07788 |
| 2017/0373389 A1* | 12/2017 | Mandai | H01Q 1/2216 |
| 2017/0373396 A1* | 12/2017 | Kato | H01F 27/006 |
| 2018/0068213 A1* | 3/2018 | Kataoka | G06K 19/0726 |
| 2018/0102814 A1* | 4/2018 | Yasutake | G06K 7/10178 |
| 2018/0107913 A1* | 4/2018 | Shi | H01Q 1/243 |
| 2018/0114042 A1* | 4/2018 | Tenno | G06K 7/10336 |
| 2018/0123221 A1* | 5/2018 | Finn | H01Q 1/2225 |
| 2018/0131093 A1* | 5/2018 | Tenno | H01Q 7/08 |
| 2018/0137399 A1* | 5/2018 | Kato | H01Q 19/26 |
| 2018/0144225 A1* | 5/2018 | Kato | H01Q 1/2225 |
| 2018/0151951 A1* | 5/2018 | Ikemoto | H05K 1/181 |
| 2018/0159203 A1* | 6/2018 | Baks | H01Q 1/065 |
| 2018/0211499 A1* | 7/2018 | Forster | G08B 13/2448 |
| 2018/0212649 A1* | 7/2018 | Ten | H04B 5/0081 |
| 2018/0241126 A1* | 8/2018 | Nomura | H01F 27/2804 |
| 2018/0269708 A1* | 9/2018 | Yeh | H01L 21/56 |
| 2018/0293480 A1* | 10/2018 | Osamura | G06K 19/0775 |
| 2018/0302125 A1* | 10/2018 | Ten | H01Q 1/22 |
| 2018/0339503 A1* | 11/2018 | Finn | G06K 19/07722 |
| 2018/0351240 A1* | 12/2018 | Kato | H01Q 7/08 |
| 2018/0358685 A1* | 12/2018 | Han | H01Q 1/2283 |
| 2019/0044219 A1* | 2/2019 | Yamaguchi | H04B 5/0081 |
| 2019/0073579 A1* | 3/2019 | Kato | G06K 19/0775 |
| 2019/0080215 A1* | 3/2019 | Kobayashi | H01Q 7/00 |
| 2019/0081402 A1* | 3/2019 | Kato | H01Q 9/065 |
| 2019/0096828 A1* | 3/2019 | Wu | H01L 21/6835 |
| 2019/0109617 A1* | 4/2019 | Omori | G06K 19/077 |
| 2019/0114526 A1* | 4/2019 | Finn | H01Q 21/29 |
| 2019/0115953 A1* | 4/2019 | Kato | H04B 5/0031 |
| 2019/0130239 A1* | 5/2019 | Kimura | H01Q 9/16 |
| 2019/0138876 A1* | 5/2019 | Nakano | G06K 19/0726 |
| 2019/0156073 A1* | 5/2019 | Finn | G06K 19/07722 |
| 2019/0156175 A1* | 5/2019 | Eshima | G06K 19/025 |
| 2019/0173178 A1* | 6/2019 | Kato | H01Q 1/40 |
| 2019/0188550 A1* | 6/2019 | Kato | G06K 19/07745 |
| 2019/0197385 A1* | 6/2019 | Finn | H01Q 7/00 |
| 2019/0199001 A1* | 6/2019 | Kato | H01Q 11/02 |
| 2019/0205714 A1* | 7/2019 | Forster | G06K 19/0725 |
| 2019/0205715 A1* | 7/2019 | Kato | G06K 19/07777 |
| 2019/0208636 A1* | 7/2019 | Kato | H01Q 9/26 |
| 2019/0213461 A1* | 7/2019 | Kato | H01Q 1/2225 |
| 2019/0252781 A1* | 8/2019 | Isayama | H01F 27/292 |
| 2019/0266468 A1* | 8/2019 | Kato | H01Q 1/273 |
| 2019/0267698 A1* | 8/2019 | Mukherjee | H01Q 7/00 |
| 2019/0280366 A1* | 9/2019 | Kato | G06K 19/0723 |
| 2019/0341692 A1* | 11/2019 | Kubo | H04B 5/0025 |

* cited by examiner

RFID SYSTEM

BACKGROUND OF THE INVENTION

1. Field of the Invention

The present invention relates to an RFID (Radio Frequency Identification) system and, in particular, to a UHF band RFID system used for short-distance communication between a reader/writer and an RFID tag.

2. Description of the Related Art

As a system for managing articles, an RFID system that establishes, on the basis of a non-contact method, communication between a reader/writer and an RFID tag, and transmits information between the reader/writer and the RFID tag is known. The RFID tag includes an RFIC chip used to process a wireless signal and an antenna used to transmit and receive the wireless signal, and predetermined information is transmitted and received as a high-frequency signal between the antenna of the RFID tag and the antenna of the reader/writer through a magnetic field or a radio wave.

Since the RFID tag is to be attached to an article, a reduction in size thereof is required.

As an RFID system that uses a small RFID tag, for example, a system is disclosed in Japanese Unexamined Patent Application Publication No. 2002-183676 where an RFID tag, in which a minute antenna coil is formed on a wireless IC chip, is utilized and by moving a resonance body including a capacitor and a coil, provided in a leading end portion of a reader/writer, closer to this tag, information is read and written.

However, in the RFID system disclosed in Japanese Unexamined Patent Application Publication No. 2002-183676, when the RFID tag is mounted to a mother substrate, such as printed wiring board, for example, the RFID tag is influenced by a metallic substance, such as another mounted component or a circuit pattern, for example, provided in the printed wiring board, and a communication distance is reduced or no communication is established. In addition, due to the influence of the metallic substance, the resonance frequency of the resonance body deviates and the transmission efficiency of a high-frequency signal is reduced, in some cases. In particular, when a metallic body is located adjacent to a portion in which the RFID tag is disposed, the deviations of the resonance frequency and the reduction in transmission efficiency becomes significant.

SUMMARY OF THE INVENTION

To overcome the problems described above, preferred embodiments of the present invention provide an RFID system that is capable of maintaining a communication distance and that is superior in terms of the transmission efficiency of a high-frequency signal, even if it is mounted in a mother substrate.

In an RFID system according to a preferred embodiment of the present invention, preferably, a loop antenna including a loop conductor is used as an antenna on a reader/writer side, a coil antenna including a plurality of laminated coil conductors is used as an antenna on an RFID tag side, and a conductor width of the loop conductor in the loop antenna is greater than a conductor width of the coil conductor in the coil antenna.

Since the loop antenna defined by the loop conductor is used as the reader/writer-side antenna, and the conductor width of the loop conductor in the loop antenna is greater than the conductor width of the coil conductor in the coil antenna, it is possible to concentrate a magnetic flux on the center line of a winding axis in the loop antenna with a conductor loss in the loop antenna being reduced. In addition, since the loop of the magnetic flux becomes large, it is possible to radiate the magnetic flux farther. Furthermore, since the coil antenna formed by laminating the plural coil conductors is used as the RFID tag-side antenna, and the conductor width of the coil conductors is relatively small, it is possible to reduce a stray capacitance component occurring between the coil antenna and a metallic substance in a mother substrate, and it is possible to minimize the influence of the metallic substance. Accordingly, it is possible to improve the degree of coupling between the RFID tag and the reader/writer, and it is possible to maintain a sufficient communication distance. Therefore, it is possible to provide an RFID system that is superior in terms of favorable transmission efficiency of a high-frequency signal.

According to various preferred embodiments of the present invention, it is possible to provide an RFID system that is capable of maintaining a sufficient communication distance and that is superior in terms of the transmission efficiency of a high-frequency signal.

The above and other elements, features, steps, characteristics, and advantages of the present invention will become more apparent from the following detailed description of the preferred embodiments with reference to the attached drawings.

BRIEF DESCRIPTION OF THE DRAWINGS

FIGS. 2A and 2B illustrate the RFID system, wherein FIG. 2A is a plan view showing a positional relationship between a reader/writer-side antenna and an RFID tag-side antenna, and FIG. 2B is a side view.

FIGS. 4A and 4B illustrate the reader/writer-side antenna in the RFID system, wherein FIG. 4A is a perspective view from a back surface side, and FIG. 4B is a circuit diagram.

DETAILED DESCRIPTION OF THE PREFERRED EMBODIMENTS

Figure 1:
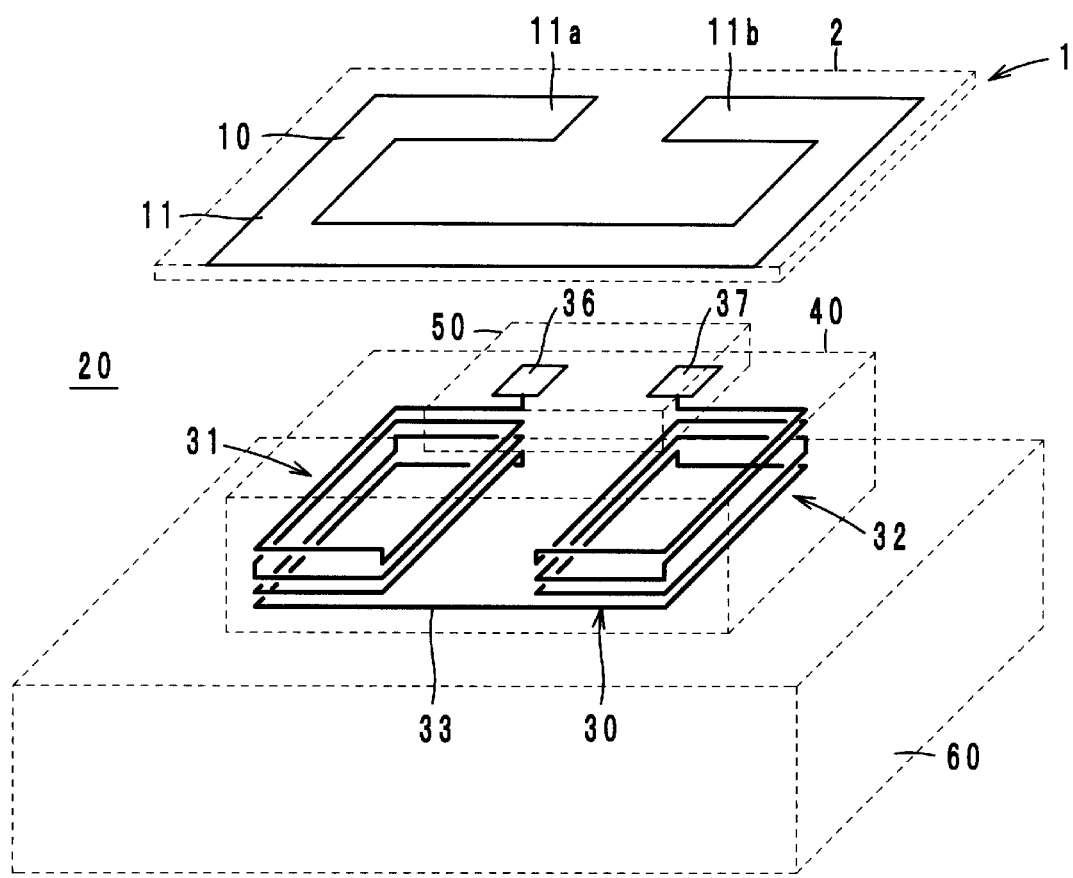
FIG. 1 is a perspective view illustrating an RFID system according to a preferred embodiment of the present invention.

Hereinafter, RFID systems according to preferred embodiments of the present invention will be described with reference to accompanying drawings. In addition, in each drawing, a common reference character is assigned to the same component or the same portion, and redundant description thereof is omitted.

RFID System and First Example of RFID Tag

An RFID system according to a preferred embodiment is preferably a system in which the transmission of information is performed between a reader/writer and an RFID tag on the basis of a non-contact method, and more specifically, is an RFID system in which the transmission and reception of a high-frequency signal of a UHF band or an SHF band is performed between the antenna of a reader/writer and the antenna of an RFID tag, which are disposed so as to be adjacent to each other with a distance ranging from several mm to several cm therebetween.

First, with reference to FIGS. 1 to 4B, the configurations of a reader/writer in the RFID system and an RFID tag as a first example of a preferred embodiment of the present invention will be described.

As illustrated in FIG. 1, the reader/writer preferably includes an antenna head 1 including a loop antenna 10 provided on the front surface of a supporting member 2. The loop antenna 10 is preferably defined by a loop conductor 11 of approximately one turn, whose power feeding ends are a power feeding portion 11a and a power feeding portion 11b, and the power feeding portion 11a and the power feeding portion 11b are connected to an information processing circuit in the main body of the reader/writer, not illustrated.

An RFID tag 20 preferably includes a coil antenna 30, formed by laminating a plurality of coil conductors embedded in a power feeding substrate 40, and an RFIC element 50 connected to the coil antenna 30. The coil antenna 30 preferably includes a first coil antenna 31 and a second coil antenna 32 adjacently disposed within the power feeding substrate 40 so that the winding axes of the coil antennas 31 and 32 are parallel or substantially parallel to each other, and the coil antennas 31 and 32 are magnetically coupled to each other. In addition, while being described hereinafter in detail, the coil antenna 30 preferably further includes a third coil antenna 31. The coil antenna 30 is provided within the power feeding substrate 40, and the power feeding substrate 40 is defined by a laminated body formed by laminating a plurality of dielectric layers. The power feeding substrate 40 is mounted on a mother substrate 60, such as a printed wiring board, for example, and the RFIC element 50 is mounted on the front surface of the power feeding substrate 40. The RFIC element 50 preferably includes a logic circuit, a memory circuit, and other suitable circuit elements, and is connected, as a bare IC chip or a packaged IC chip, to terminals 36 and 37 on the power feeding substrate 40 through input-output terminals on the back surface thereof.

Figure 2A:
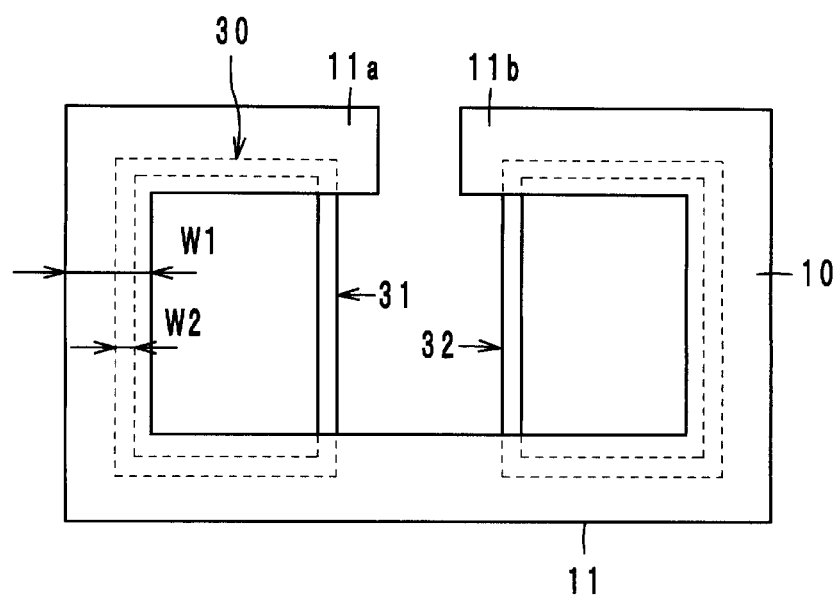
Figure 2B:
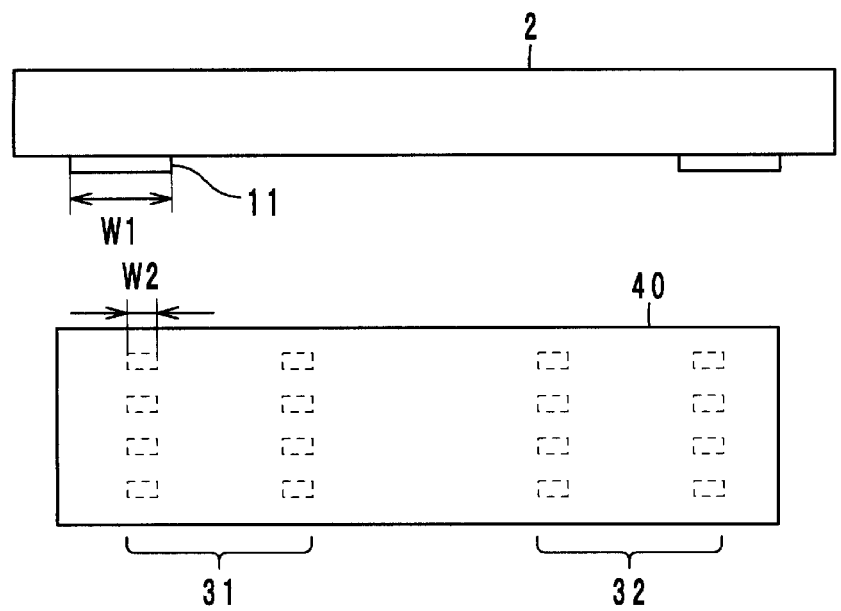

As illustrated in FIGS. 2A and 2B, in planar view of the loop antenna 10 on a reader/writer side and the coil antenna 30 on an RFID tag 20 side, an area occupied by the loop antenna 10 is approximately equal to or slightly greater than the total area of an area occupied by the coil antenna 30, namely, an area occupied by the first coil antenna 31 and an area occupied by the second coil antenna 32. In addition, the area occupied by the loop antenna 10 is an area on an inner side with respect to a periphery of the loop antenna 10, and the area occupied by the coil antenna 30 is an area on an inner side with respect to the peripheries of the coil antennas 31 and 32.

In addition, in the present preferred embodiment, the loop conductor 11 of the loop antenna 10 is preferably wound on a plane surface, and the coil conductors of the coil antennas 31 and 32 are preferably primarily wound in a lamination direction. Furthermore, the loop antenna 10 is configured such that the conductor width of the loop conductor 11 in the loop antenna 10 is preferably greater than the conductor widths of the coil conductors in the coil antennas 31 and 32. Specifically, when the conductor width of the loop conductor 11 in the loop antenna is denoted as W1 and the conductor widths of the coil conductors of the coil antennas 31 and 32 are denoted as W2, the conductor width of the loop conductor 11 is set so as to satisfy a relationship of W1>W2.

Figure 3:
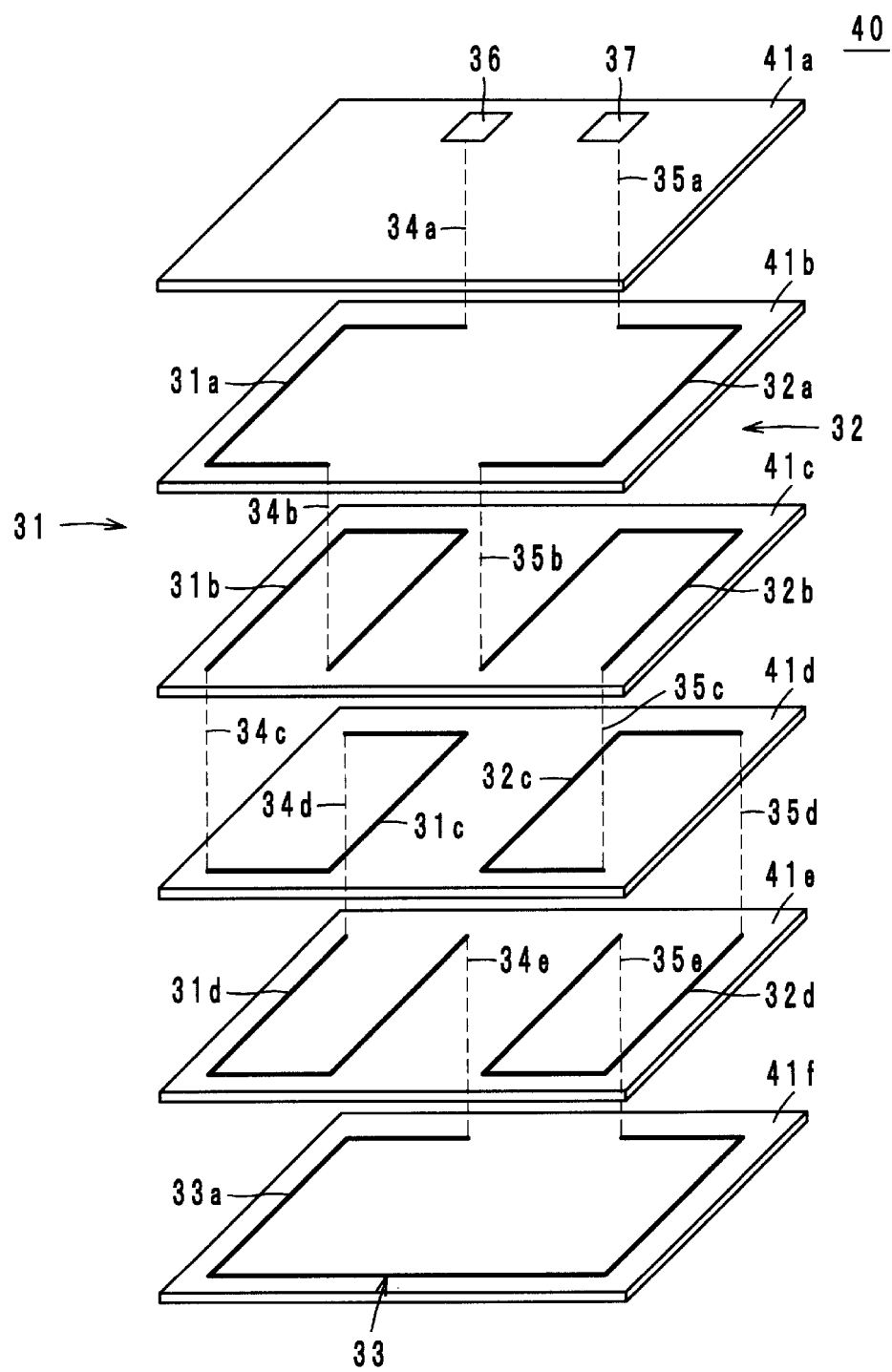
FIG. 3 is an exploded view of a power feeding substrate in the RFID system.

As illustrated in FIG. 3, the power feeding substrate is preferably defined by a laminated body formed by laminating a plurality of ceramic dielectric layers 41a to 41f, and includes therein the coil conductors 31a to 31d and 32a to 32d and interlayer conductors 34a to 34e and 35a to 35e of the coil antennas 31 and 32. Each of the ceramic dielectric layers 41a to 41f is preferably made of dielectric material, such as LTCC (Low Temperature Co-fired Ceramic) material or other suitable material, whose relative permittivity εr is greater than or equal to about 6, for example. The coil conductors 31a to 31d and 32a to 32d and the interlayer conductors 34a to 34e and 35a to 35e are preferably made of low-melting-point metal material whose main constituent is copper or silver and whose resistivity is relatively small, for example. Particularly, the laminated body is preferably obtained by simultaneously sintering a coil conductor or an interlayer conductor and a plurality of ceramic dielectric layers.

In the dielectric layer 41a, the terminal 36 and the terminal 37 are provided to be connected to two input-output terminals of the RFIC element 50, and the terminal 36 is connected to one end of the coil conductor 31a, provided in the dielectric layer 41b, through the interlayer conductor 34a provided in the dielectric layer 41a. The coil conductor 31a preferably has a small-diameter loop shape in the surface of the dielectric layer 41b, and the other end thereof is connected to one end of the coil conductor 31b provided in the dielectric layer 41c, through the interlayer conductor 34b provided in the dielectric layer 41b. The coil conductor 31b preferably has a small-diameter loop shape in the surface of the dielectric layer 41c, and the other end thereof is connected to one end of the coil conductor 31c provided in the dielectric layer 41d, through the interlayer conductor 34c provided in the dielectric layer 41c. The coil conductor 31c preferably has a small-diameter loop shape in the surface of the dielectric layer 41d, and the other end thereof is connected to one end of the coil conductor 31d provided in the dielectric layer 41e, through the interlayer conductor 34d provided in the dielectric layer 41d. The coil conductor 31d preferably has a small-diameter loop shape in the surface of the dielectric layer 41e, and the other end thereof is connected to one end of the coil conductor 33a provided in the dielectric layer 41f, through the interlayer conductor 34e provided in the dielectric layer 41e.

Furthermore, the coil conductor 33a preferably has a large-diameter loop shape in the surface of the dielectric layer 41f, and the other end thereof is connected to one end of the coil conductor 32d provided in the dielectric layer 41e, through the interlayer conductor 35e provided in the dielectric layer 41e. The coil conductor 32d preferably has a small-diameter loop shape in the surface of the dielectric layer 41e, and the other end thereof is connected to one end of the coil conductor 32c provided in the dielectric layer 41d, through the interlayer conductor 35d provided in the dielectric layer 41d. The coil conductor 32c preferably has a small-diameter loop shape in the surface of the dielectric layer 41d, and the other end thereof is connected to one end of the coil conductor 32b provided in the dielectric layer 41c, through the interlayer conductor 35c provided in the dielectric layer 41c. The coil conductor 32b preferably has a small-diameter loop shape in the surface of the dielectric layer 41c, and the other end thereof is connected to one end of the coil conductor 32a provided in the dielectric layer 41b, through the interlayer conductor 35b provided in the dielectric layer 41b. The coil conductor 32a preferably has a small-diameter loop shape in the surface of the dielectric layer 41b, and the other end thereof is connected to the terminal 37 provided in the dielectric layer 41a, through the interlayer conductor 35a provided in the dielectric layer 41a.

Particularly, the first coil antenna 31 is configured using the small-diameter coil conductors 31a to 31d and the interlayer conductors 34a to 34e, and the second coil antenna 32 is configured using the small-diameter coil conductors 32a to 32d and the interlayer conductors 35a to 35e. Furthermore, in the present preferred embodiment, the third coil antenna 33 including the large-diameter coil conductor 33a is also included. As illustrated in FIG. 3, the coil conductors 31a to 31d, 32a to 32d, and 33a in the first coil antenna 31, the second coil antenna 32, and the third coil antenna 33 are wound so that the directions of currents flowing in the individual coil conductors are aligned in a same direction, i.e., the directions of induction magnetic fields generated by the currents flowing in the individual coil conductors are aligned in a same direction.

Preferably, the first coil antenna 31, the second coil antenna 32, and the third coil antenna 33 are adjacently disposed within the power feeding substrate 40 so that the winding axes of the individual coiled antennas are parallel or substantially parallel to one another, and the first coil antenna 31, the second coil antenna 32, and the third coil antenna 33 are magnetically coupled to one another. In addition, in planar view, an area occupied by the loop antenna 10 on a reader/writer side is preferably approximately equal to the area of a portion surrounded by the outside dimension of an antenna on an RFID tag 20 side, i.e., the outside dimensions of the first coil antenna 31, the second coil antenna 32, and the third coil antenna 33.

Figure 4A:
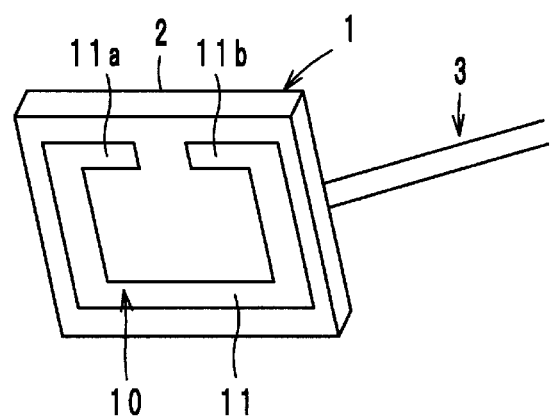
Figure 4B:
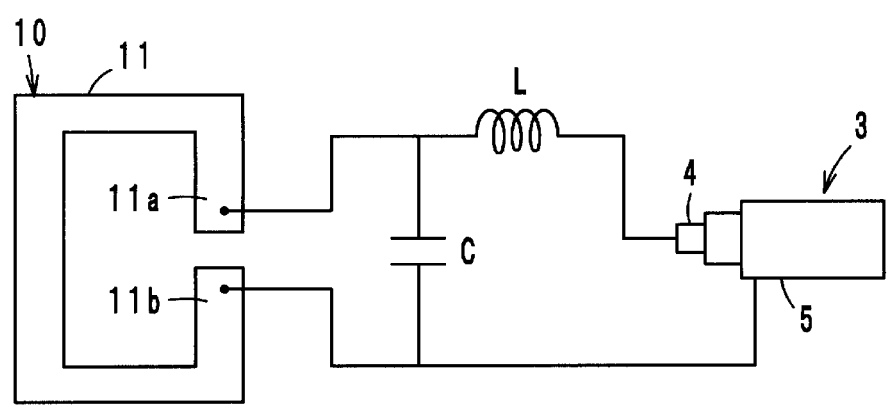

As illustrated in FIG. 4A, the reader/writer-side antenna is preferably configured as the loop antenna 10 provided in one main surface of the flat plate-shaped supporting member 2 including a rigid member, such as an epoxy resin, for example, and a coaxial cable 3 is connected to the other main surface of the supporting member 2. As illustrated in FIG. 4B, between the loop antenna 10 and the coaxial cable 3, a matching circuit is preferably provided and includes a capacitance element C and an inductance element L, and the power feeding portion 11a and the power feeding portion 11b in the loop antenna 10 are connected to an internal conductor 4 of the coaxial cable 3 and an external conductor 5 of the coaxial cable 3, respectively, through the matching circuit. The coaxial cable 3 is preferably configured as a 50Ω line, for example, and due to the matching circuit, matching between the impedance of the coaxial cable 3 and the impedance of the loop antenna 10 is achieved.

Next, with reference to FIG. 5 to FIG. 7, the usage pattern and the operating principle of the RFID system of the present preferred embodiment will be described.

Figure 5:
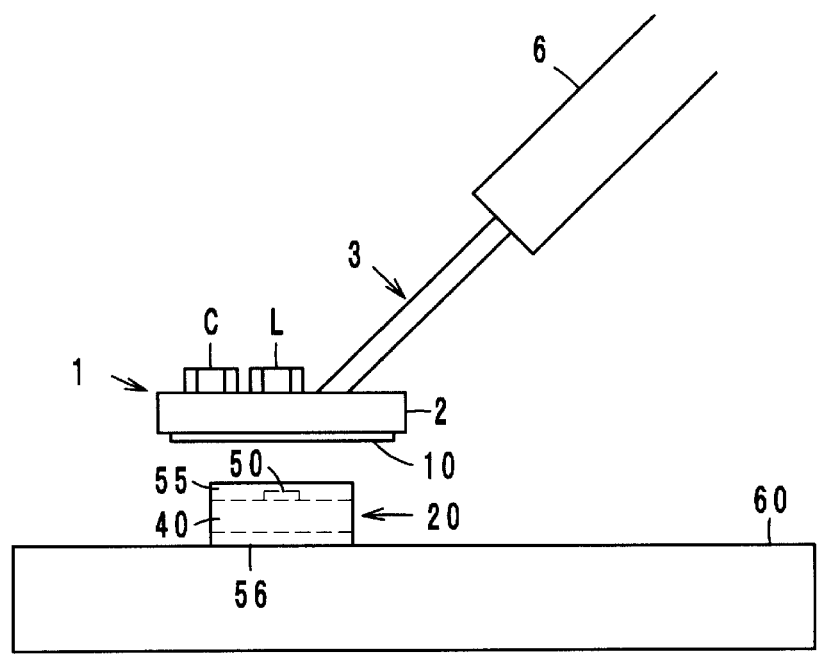
FIG. 5 is an explanatory diagram illustrating a usage pattern of the RFID system.

As illustrated in FIG. 5, the antenna head 1 in the reader/writer preferably includes the loop antenna 10 provided in one main surface of the supporting member 2 and the matching circuit element including the capacitance element C and the inductance element L provided in the other main surface of the supporting member 2. This antenna head 1 is connected to a gripper 6 through the coaxial cable 3, and is preferably configured as a pen-shaped antenna capable of being used with the gripper 6 being gripped. The pen-shaped reader/writer-side antenna is further connected to a reader/writer main body, not illustrated, in a DC manner or through a magnetic field or an electromagnetic field.

The RFID tag 20 preferably includes the rectangular or substantially rectangular flat plate-shaped power feeding substrate 40 and the RFIC element 50 mounted thereon, and the RFIC element 50 is sealed using a sealing material 55, such as an epoxy resin, for example. This RFID tag 20 is mounted to the mother substrate 60, such as a printed wiring board, for example, through a joint material 56 including insulating material, such as resin, or conductive material, such as solder, for example.

Figure 6:
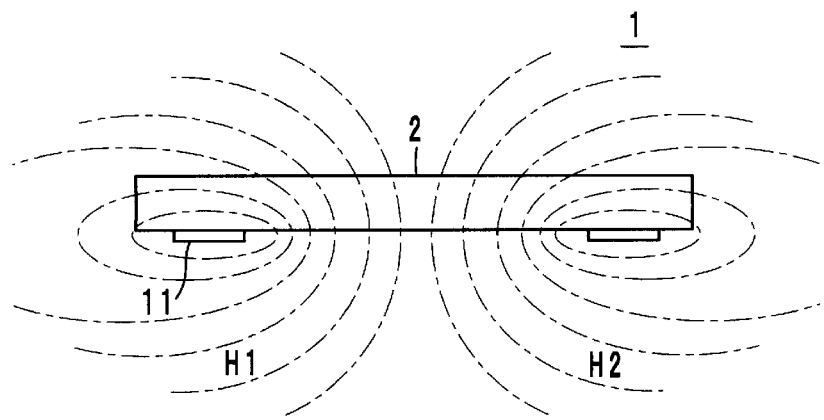
FIG. 6 is an explanatory diagram illustrating an operating principle in the RFID system.
Figure 6:
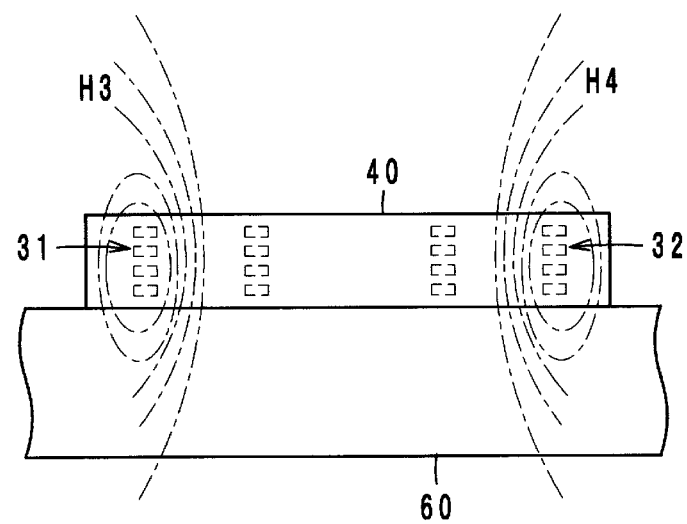
Figure 7:
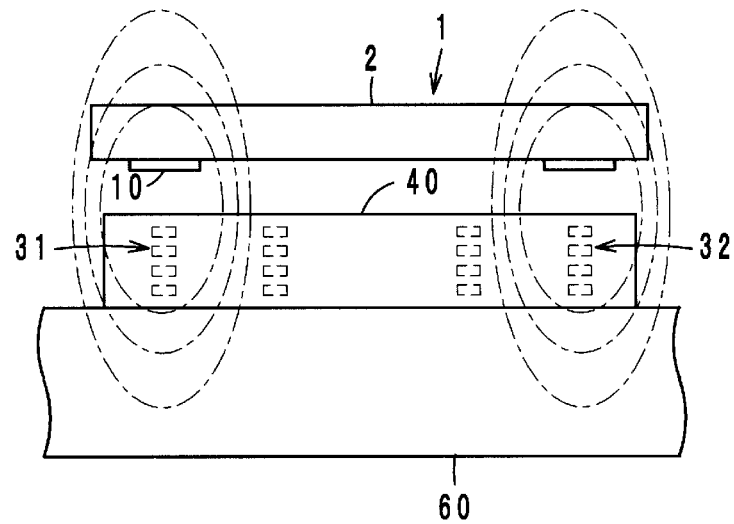
FIG. 7 is an explanatory diagram illustrating an operating principle in the RFID system.

In the present preferred embodiment, as illustrated in FIG. 6, the loop antenna 10 is used as the reader/writer-side antenna, the coil antenna 30 (31, 32) is used as the RFID tag 20-side antenna, and furthermore, the conductor width of the loop conductor 11 in the loop antenna 10 is preferably greater than the conductor widths of the coil conductors 31a to 31d and 32a to 32d in the coil antennas 31 and 32. Therefore, in a state in which the antenna head 1 is adjacent to the RFID tag 20, magnetic fields H1, H2, H3, and H4 indicated by dashed lines in FIG. 6 are generated, and through these magnetic fields, a high-frequency signal is transmitted and received between the loop antenna 10 and the coil antennas 31 and 32. Particularly, while maintaining a low conductor loss, the magnetic fields H1 and H2 generated due to the loop conductor 11 of the loop antenna 10 cause an aperture portion magnetic field to be concentrated and widely spread. In addition, as illustrated in FIG. 7, this magnetic flux interlinks with the coil conductors of the coil antennas 31 and 32.

In this manner, since, in the loop antenna 10 and the coil antennas 31 and 32, it is possible to concentrate a magnetic field in each aperture portion, even if the mother substrate 60 is metal or metal is disposed in the vicinity of the mother substrate 60, it is possible for magnetic fields to be intensively interlinked with the coil antennas 31 and 32. In addition, in the coil antennas 31 and 32, the conductor widths are narrowed and laminated structures are utilized, and thus, it is possible to focus the magnetic fields H3 and H4 primarily in a direction perpendicular or substantially perpendicular to the coil surfaces thereof. In addition to this, even if the mother substrate 60 is metal, capacitance occurring between the mother substrate 60 and the coil antennas 31 and 32 is relatively small, and has a small effect on a resonance frequency. Furthermore, since a high-frequency signal of the UHF band or a frequency band higher than the UHF band is utilized, even if the RFID tag is mounted to the mother substrate 60, the high-frequency signal is not significantly influenced by another mounted component mounted to the mother substrate 60 or metallic substances, such as various kinds of wiring patterns, for example, provided in the mother substrate 60. In addition, as for the magnetic fields H1 and H2 in the loop antenna 10, since the conductor width of the loop antenna 10 is relatively wide, the magnetic fields H1 and H2 in the loop antenna 10 widely spread primarily in a direction parallel or substantially perpendicular to the loop plane thereof, and even if the relative position of the loop antenna 10 in a planar direction with respect to the RFID tag 20 somewhat deviates, the magnetic fields H1 and H2 generated on the loop antenna 10 side easily interlink with the coil antennas 31 and 32, and an area in which reading and writing can be performed is increased.

The RFID system of the present preferred embodiment is configured such that the reader/writer-side antenna and the RFID tag-side antenna are disposed close to each other, and communication with the RFID tag 20 that is a target of reading and writing for the reader/writer is established with only the RFID tag 20. In this case, for example, the outside dimension of the coil antenna 10 is preferably less than or equal to about 1 cm long× about 1 cm wide, for example, and furthermore, it is possible to configure the coil antenna 10 in an extremely small size of less than or equal to about 0.5 cm long× about 0.5 cm wide, for example. Specifically, for example, when an operation frequency band is a UHF band of about 860 MHz to about 960 MHz, the size of the power feeding substrate 40 is about 3.2 mm long× about 1.6 mm wide, the outside dimension of the coil antenna 30 is about 2.5 mm long× about 1.2 mm wide, the outside dimension of the loop antenna 10 is about 3.0 mm long× about 4.0 mm wide, the conductor width of the loop conductor 11 is about 0.5 mm, and an output power value is about 1 W, it is possible to perform reading and writing even if a distance between the reader/writer-side antenna and the RFID tag-side antenna is about 6 mm. Further, by increasing the output power value or increasing the size of the power feeding substrate 40, and more particularly, the size of the coil antenna 30, it is possible to further increase the communication distance.

While the present invention has been described with reference to a specific preferred embodiment, the present invention is not limited to the above-described configuration.

Figure 8:
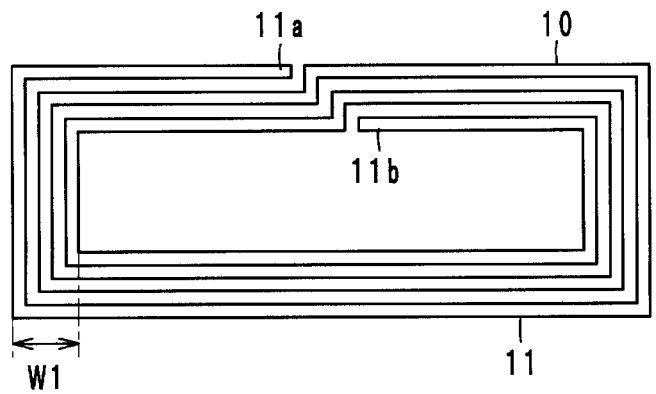
FIG. 8 is a plan view illustrating an example of a modification to the reader/writer-side antenna in the RFID system.

For example, as illustrated in FIG. 8, the reader/writer-side antenna is not a loop antenna including one turn but may preferably be configured using the loop antenna 10 including a plurality of turns. In this case, a distance between the outermost diameter and the innermost diameter of the loop antenna 10 is the conductor width W1 of the loop conductor 11 in the loop antenna 10. In addition, while it is preferable that the loop antenna 10 includes a loop-shaped single-layer conductor, the loop conductor may preferably include a plurality of layers if each of the layers is thinner than the thickness of the coil antenna 30 in a lamination direction.

As described above, it is preferable that the winding directions of the first coil antenna and the second coil antenna are the same. If coil conductors defining individual coil antennas are configured so that the winding directions thereof are the same, currents in the individual coil antennas flow in the same direction, and induction magnetic fields due to the currents are also generated in the same direction. Accordingly, the currents generated in the individual coil antennas do not cancel each other out, and the energy transmission efficiency of a high-frequency signal is improved. Therefore, a communication distance between the reader/writer-side antenna and the RFID tag-side antenna is increased. In addition, the coil antennas have a laminated structure, and when the coil antennas are arranged in a position at which the winding axes of two coil antennas overlap with each other in planar view, it is possible to enlarge the sum of opening areas in the coil antennas. As a result, since magnetic flux density increases, the communication distance further increases.

In addition, since the reader/writer-side antenna is a loop antenna and the RFID tag-side antenna is a coil antenna, communication between the reader/writer and the RFID tag is performed primarily through a magnetic field. However, in this regard, if the conductor width of the loop conductor in the loop antenna is greater than the conductor width of the coil conductor in the coil antenna, and a ratio between the outside dimension of the loop antenna and the outside dimension of the coil antenna falls within a predetermined range, when the antenna head 1 and the RFID tag are disposed at an extremely short distance from each other so that the distance is less than or equal to about 2 mm, for example, capacitive coupling, in addition to the magnetic field coupling, is provided. Accordingly, even if electric power is extremely small, it is possible to perform wireless communication. Furthermore, preferably, the conductor width of the loop antenna is relatively wide, and the conductor width of the coil antenna on the RFID tag side is relatively narrow. Therefore, even if the locations of the loop antenna and the coil antenna deviate, the change of a capacitance value between the loop antenna and the coil antenna is very small, and accordingly, the change of a characteristic is very small.

When it is intended to perform communication at such a short distance, it is preferable that the area occupied by the loop antenna of the reader/writer is about 0.2 to about 6 times as large as the area occupied by the coil antenna of the RFID tag. If the area occupied by the loop antenna is less than an area about 0.2 times as large as the area occupied by the coil antenna, it is difficult to fully transmit and receive a high-frequency signal, in some cases. On the other hand, if the area occupied by the loop antenna is greater than an area about 6 times as large as the area occupied by the coil antenna, it is difficult to concentrate the magnetic flux of the loop antenna and even if the loop antenna is arranged adjacent to the coil antenna, a region in which it is difficult to perform reading and writing, namely, a null point, tends to occur. In addition, when the loop antenna is disposed at an extremely small distance, it is difficult for capacitive coupling to occur.

In addition, it is preferable that the coil antenna is configured so that the imaginary portion of the impedance of the RFIC element and the imaginary portion of the impedance of the coil antenna have a conjugate relationship with each other at the operation frequency. Namely, it is preferable that the coil antenna provided in the power feeding substrate has a function to match the impedance of the RFIC element in addition to having a function as an antenna. While the coil antenna has a resonance frequency due to an inductance component of the coil itself and a capacitance component produced between lines, it is preferable that this resonance frequency is located near the operation frequency. It is further preferable that the real portions of the impedances coincide or substantially coincide with each other. In particular, when an antenna in which the first coil antenna and the second coil antenna are magnetically coupled to each other is used as the coil antenna, the operation frequency band may have a wider bandwidth.

In addition, the RFID tag may preferably be attached to the mother substrate using a bonding material, such as a double-stick tape, an adhesive material, or other suitable material, for example, and in this case, after being processed into a seal, a label, a tape, or other item, the RFID tag may also preferably be attached to the mother substrate. At this time, in the RFID tag, any one of the RFIC element side and the power feeding substrate side thereof may be used as the surface to be attached to the mother substrate. In particular, if the RFIC element is covered by a sealing material, it is possible to protect the RFIC element, and it is possible to attach the RFIC element to the mother substrate using the upper surface of the sealing material.

While a base material defining the power feeding substrate may also preferably be made of a typical resin material having relative permittivity εr in a range of about 3 to about 4, if the power feeding substrate is configured using a material such as a ceramic dielectric, for example, whose relative permittivity εr is high, it is possible to achieve stable operation of the RFID system. Specifically, since line-line capacitance between the coil conductors is dependent upon the quality of material provided the coil conductors, the influence of the relative permittivity of the material used for the mother substrate is reduced, and fluctuations of stray capacitance is less likely to occur. In addition, the change of the inductance value of the coil conductor is also relatively small. Therefore, the change of the resonance frequency is small, and the communication distance is ensured, regardless of a usage environment.

While the RFID tag may preferably be mounted to various mother substrates, such as a printed wiring board, for example, the RFID tag may also be mounted on a metallic plate. In this case, in the RFID tag, preferably, a surface on a side on which the RFIC element is provided is used as a mounting surface for a metallic plate, and a power feeding substrate side is used as a top surface side. Accordingly, communication with the reader/writer is more reliable. When the surface on the power feeding substrate side is used as the mounting surface for a metallic plate, the coil antenna is disposed as close to the upper side of the power feeding substrate as possible. Accordingly, it is possible to secure a path through which a magnetic flux passes, between the coil antenna and the metallic plate, and it is possible to stabilize an operation on the metallic plate.

It is preferable that the antenna head in the reader/writer is configured so that the coaxial cable extends in a direction oblique to the loop plane of the loop antenna and the coil plane of the coil antenna. By being configured in this manner, it is possible to reduce mutual interference between both of the magnetic field generated in the loop antenna and the magnetic field generated in the coil antenna and the coaxial cable.

In addition, it is only necessary for the coil antenna that is the RFID tag-side antenna to be a lamination-type coil antenna including a plurality of laminated coil conductors in a direction perpendicular to the loop plane of the loop antenna that is the reader/writer-side antenna, and the coil antenna may also be a single coil antenna.

Second Example of RFID Tag

Figure 9:
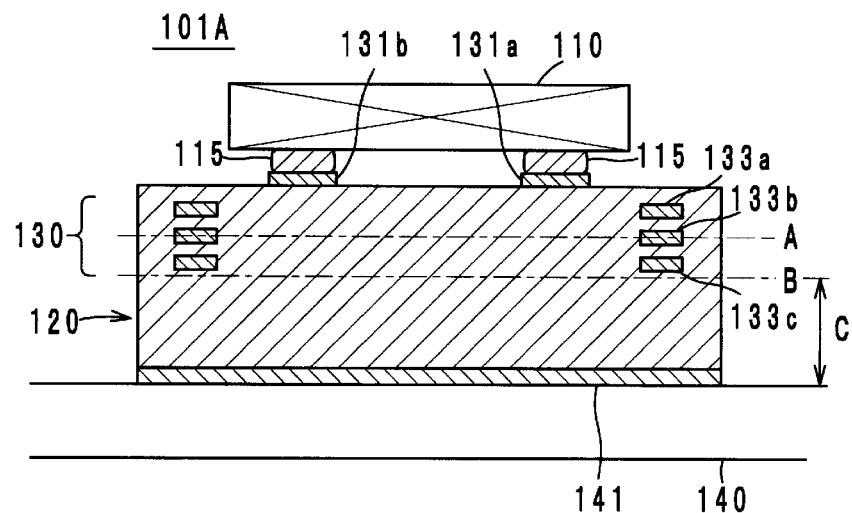
FIG. 9 is a cross-sectional view illustrating an RFID tag according to a second example of a preferred embodiment of the present invention.

As illustrated in FIG. 9, an RFID tag 101A according to a second example of a preferred embodiment of the present invention preferably includes an RFIC element 110 arranged to process a transmission/reception signal of a predetermined frequency, a power feeding substrate 120, and a coil antenna 130 embedded in the power feeding substrate 120.

Preferably, the RFIC element 110 is configured in a chip form, includes a clock circuit, a logic circuit, a memory circuit, and other suitable circuits, and stores necessary information, and a pair of input-output terminal electrodes not illustrated are provided in the back surface thereof. In addition, the RFIC element 110 is mounted on the power feeding substrate 120. The power feeding substrate 120 preferably includes a plurality of laminated layers whose main constituent is dielectric or magnetic material, for example.

As will be described hereinafter with reference to FIG. 11, the coil antenna 130 is preferably wound in a coil shape by laminating and connecting conductor patterns 133a to 133c for a coil, formed on sheets 121c to 121e of dielectric or magnetic material, to each other using via hole conductors 134a. Ends of the coil antenna 130 are preferably electrically connected to the input-output terminal electrodes of the RFIC element 110 through solder bumps 115, for example.

As illustrated in FIG. 9, the RFID tag 101A is preferably attached to a base material 140, such as a printed wiring substrate or other suitable material, through an adhesive layer 141. The coil antenna 130 is preferably embedded in the power feeding substrate 120 so that the center plane A of the antenna 130 in the lamination direction is located on a side opposite to the base material 140 with respect to the center plane B of the power feeding substrate 120. Specifically, the coil antenna 130 is preferably located a distance C away from the front surface of the base material 140.

The RFID tag 101A is capable of communicating with a reader/writer in an RFID system, not illustrated, such that the RFID tag 101A and the reader/writer define an information processing system. In this information processing system, by arranging the antenna of the reader/writer adjacent to the RFID tag 101A, a magnetic flux based on a signal of a predetermined frequency (for example, a UHF band or an HF band) radiated from the antenna penetrates the coil antenna 130, and thus a current flows in the antenna 130. This current is supplied to the RFIC element 110, thereby causing the RFIC element 110 to operate. On the other hand, a response signal from the RFIC element 110 is radiated, as a magnetic field, from the coil antenna 130, and read by the reader/writer.

Figure 10:
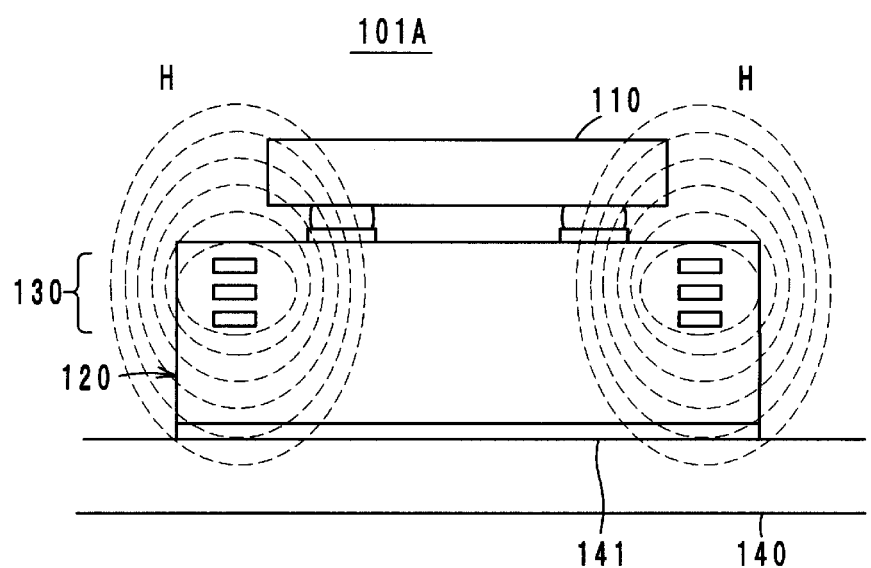
FIG. 10 is an explanatory diagram illustrating a magnetic field radiation state of the RFID tag illustrated in FIG. 9.

A magnetic field H radiated from the coil antenna 130 is indicated by dotted lines in FIG. 10. Since the coil antenna 130 is embedded in the power feeding substrate 120, and the center plane A of the antenna 130 in the lamination direction is located on a side opposite to the base material 140, such as a printed wiring substrate or other suite B of the power feeding substrate 120 in the lamination direction, the magnetic field H is primarily generated in a direction towards the antenna of the reader/writer and away from the base material 140. Therefore, an influence of a metallic substance, such as another mounted component, a conductor pattern, or other substance, for example, provided in the base material 140, is minimized, and the communication distance is not decreased.

In addition, while communication between the reader/writer and the RFID tag 101A is established primarily by a magnetic field, since the attenuation of the magnetic field with respect to a distance is greater than that of an electric field, communication is established in a relatively close state. Therefore, it is possible to establish communication with only the RFID tag to be a target to be read for the reader/writer, and there is little possibility that communication is erroneously established with a neighboring RFID tag that is not a target to be read.

It is preferable that the imaginary portion of the impedance of the RFIC element 110 and the imaginary portion of the impedance of the coil antenna 130 have a conjugate relationship with each other at the frequency of a signal used for communication. Particularly, it is preferable that the resonance frequency of the coil antenna 130 is located near the operation frequency. Further, it is preferable that the real portions of the impedances coincide or substantially coincide with each other.

In particular, when the coil antenna 130 is a lamination type coil antenna and has a relatively large aperture portion, it is possible to obtain a large inductance value with the size thereof being relatively small such that the overall size of the RFID tag 101A can be reduced. By setting the operation frequency to a short wavelength in the vicinity of about 950 MHz, for example, the size of the RFID tag 101A may be further reduced. When the frequency of a UHF band is used for communication, the RFID tag 101A may preferably have a size that is about 3.2 mm long, about 01.6 mm wide, and about 0.5 mm tall, for example.

Here, an example of the laminated structure of the power feeding substrate 120 (coil antenna 130) will be described with reference to FIG. 11. The power feeding substrate 120 is preferably obtained by forming and laminating electrodes, conductors, and via hole conductors in a plurality of sheets 121a to 121e whose main constituent is a dielectric material or a magnetic material, for example, and furthermore, sheet groups 121f and 121g used to obtain the height of the center plane A are laminated therein.

Preferably, electrodes 131a and 131b to be connected to input-output terminal electrodes of the RFIC element 110, not illustrated, and mounting electrodes 131c and 131d (to be connected to mounting terminal electrodes of the RFIC element 110, not illustrated) are provided in the sheet 121a of the first layer, connecting conductors 132a and 132b are provided in the sheet 121b of the second layer, and the conductor patterns 133a, 133b, and 133c for a coil are provided in the sheets 121c to 121e of the third layer to the fifth layer.

The conductor patterns 133a, 133b, and 133c for a coil are connected in a coil shape through via hole conductors 134a, thereby forming the antenna 130. One end of the conductor pattern 133a is connected to the electrode 131a through a via hole conductor 134b, the connecting conductor 132a, and a via hole conductor 134c. In addition, one end of the conductor pattern 133c is connected to the electrode 131b through a via hole conductor 134d, the connecting conductor 132b, and a via hole conductor 134.

When a lamination type coil antenna 130 is provided, it is possible to achieve stable operation in addition to an enlarged aperture portion. Particularly, since capacitance between the conductor patterns 133a, 133b, and 133c for a coil is dependent on the quality of material therebetween (the quality of the material of the sheet), the influence of the electric permittivity of the attachment target article of the RFID tag 101A is reduced (the fluctuation of stray capacitance is less likely to occur), and a change of the inductance value of the coil is minimized. Therefore, a change of the resonance frequency is minimized, and the communication distance ensured. In particular, by using a material having a high electric permittivity for the power feeding substrate 120, the impedance of the coil within the power feeding substrate 120 is accurately determined, and becomes insusceptible to a usage environment.

Third Example of RFID Tag

Figure 12:
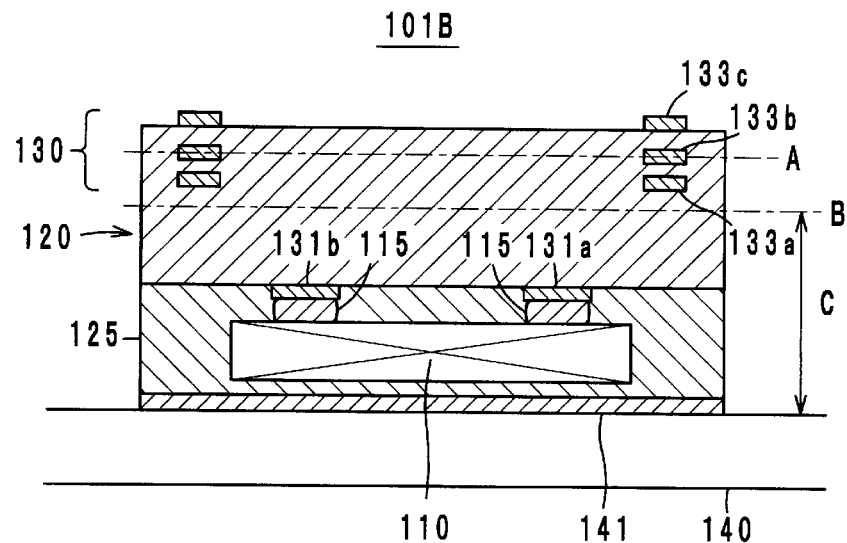
FIG. 12 is a cross-sectional view illustrating an RFID tag according to a third example of a preferred embodiment of the present invention.

As illustrated in FIG. 12, an RFID tag 101B according to a third example of a preferred embodiment of the present invention is preferably obtained by providing conductor patterns 133a, 133b, and 133c for a coil in the upper portion of the power feeding substrate 120 to define the coil antenna 130, mounting the RFIC element 110 on the back surface side of the power feeding substrate 120, and providing a sealing layer 125 so as to cover the RFIC element 110. The upper surface of the sealing layer 125 is attached to the base material 140, such as a printed wiring substrate or other suitable material, for example, through the adhesive layer 141.

In the RFID tag 101B, the coil antenna 130 is preferably embedded in the power feeding substrate 120 so that the center plane A of the antenna 130 in the lamination direction is located on a side opposite to the base material 140 with respect to the center plane B of the power feeding substrate 120. Furthermore, the sealing layer 125 is disposed between the power feeding substrate 120 and the base material 140, and thus, the distance C between the coil antenna 130 and the front surface of the base material 140 greater than in the second example.

Figure 13:
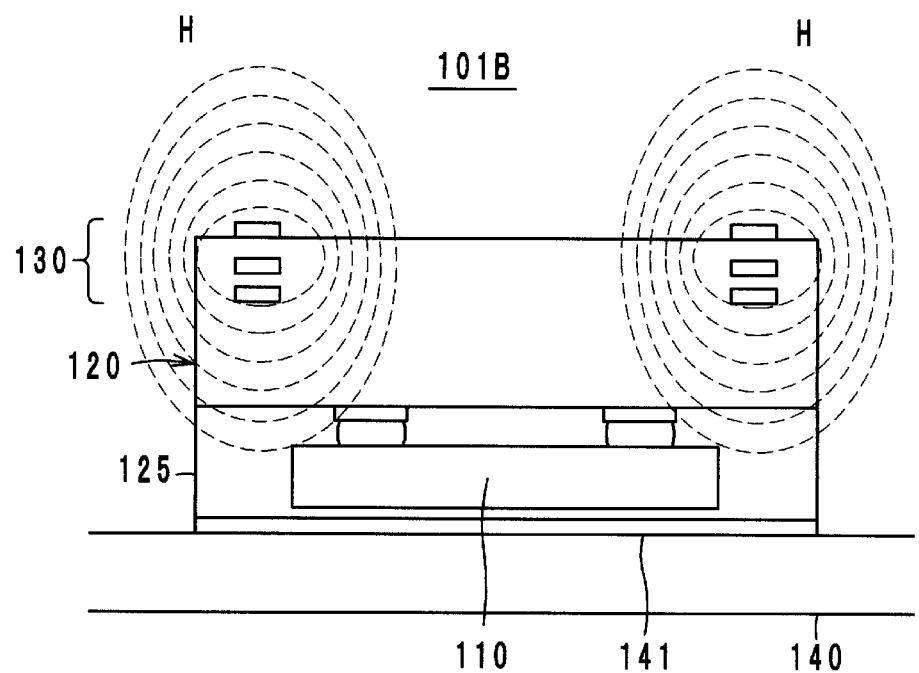
FIG. 13 is an explanatory diagram illustrating a magnetic field radiation state of the RFID tag illustrated in FIG. 12.

The operation of the RFID tag 101B is the same or substantially the same as the second example and in particular, since the distance C is increased, as illustrated by dotted lines in FIG. 13, the magnetic field H generated in the antenna 130 is farther away from the front surface of the base material 140 and is closer to the antenna of the reader/writer, not illustrated. Therefore, it is possible to more effectively eliminate the influence of a metallic substance such as another mounted component, a conductor pattern, or other metallic substance, for example, provided in the base material 140. In addition, by covering the RFIC element 110 using the sealing layer 125, the RFIC element 110 is protected from the external environment. Particularly, the RFIC element 110 is protected from an external mechanical shock. In addition, it is possible to prevent a short circuit caused by moisture or other contaminants, for example, from occurring.

Figure 11:
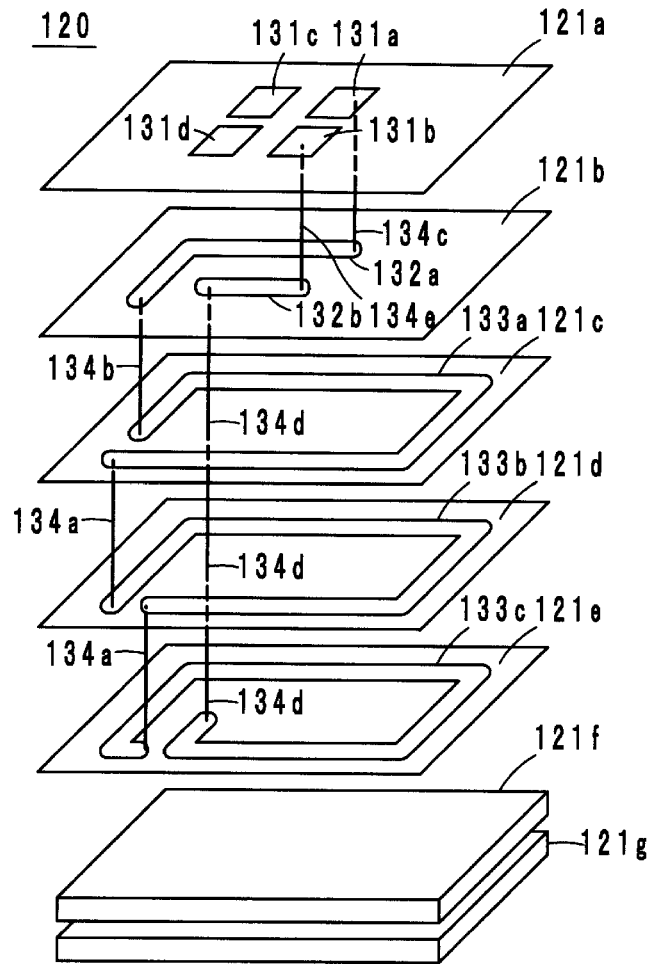
FIG. 11 is an exploded perspective view illustrating a laminated structure of the RFID tag illustrated in FIG. 9.
Figure 14:
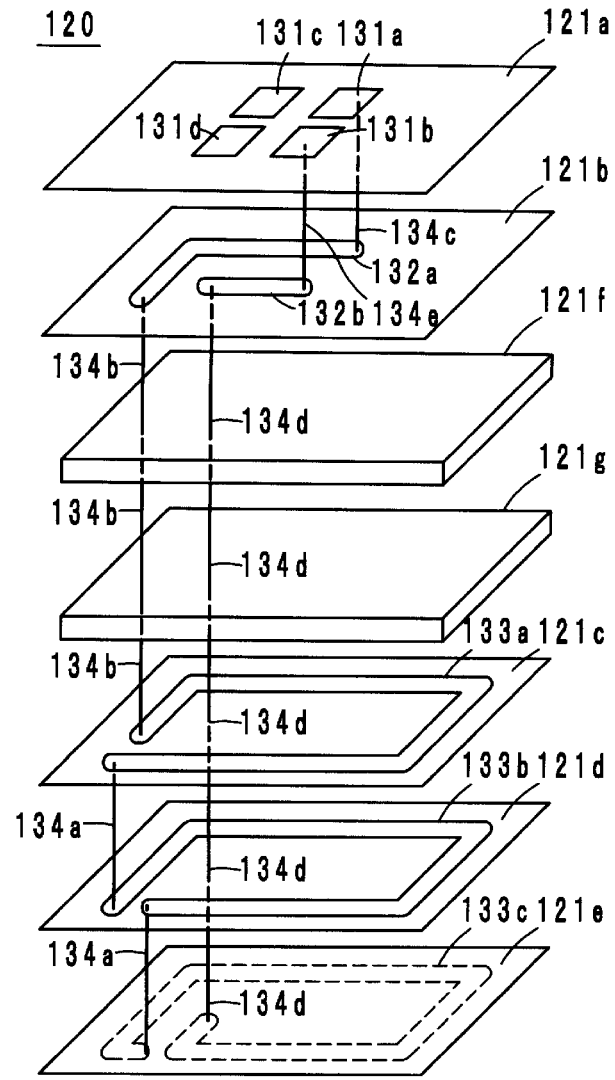
FIG. 14 is an exploded perspective view illustrating a laminated structure of the RFID tag illustrated in FIG. 12.

The laminated structure of the power feeding substrate 120 (coil antenna 30) in the present third example is illustrated in FIG. 14, the sheet groups 121f and 121g illustrated in FIG. 11 are arranged between the sheet 121b and the sheet 121c, and the conductor pattern 133c for a coil is provided in the back surface of the sheet 121e. In addition, when the RFID tag 101B is attached to the base material 140, the sheet 121e is preferably an uppermost layer.

Fourth Example of RFID Tag

Figure 15:
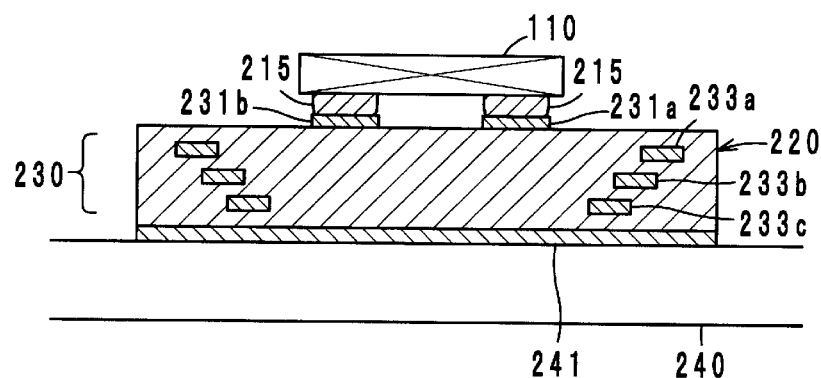
FIG. 15 is a cross-sectional view illustrating an RFID tag according to a fourth example of a preferred embodiment of the present invention.

As illustrated in FIG. 15, an RFID tag 201A according to a fourth example of a preferred embodiment of the present invention preferably includes the RFIC element 110 arranged to process a transmission/reception signal of a predetermined frequency, a power feeding substrate 220, and a coil antenna 230 embedded in the power feeding substrate 220.

Figure 17:
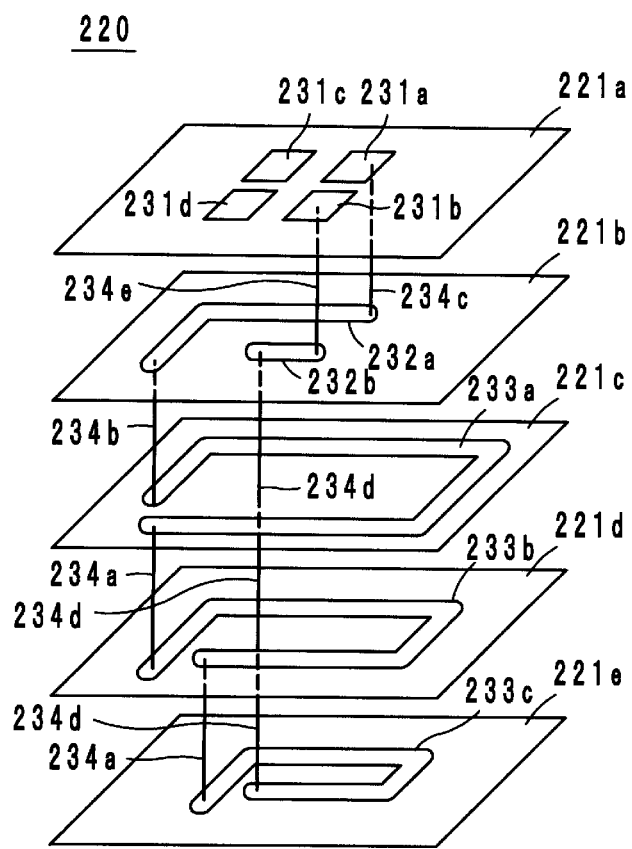
FIG. 17 is an exploded perspective view illustrating a laminated structure of the RFID tag illustrated in FIG. 15.

As will be described hereinafter with reference to FIG. 17, the coil antenna 230 is preferably wound in a coil shape by laminating and connecting conductor patterns 233a to 233c for a coil, provided on sheets 221c to 221e of dielectric or magnetic material, to each other using via hole conductors 234a. Ends of the coil antenna 230 are electrically connected to the input-output terminal electrodes of the RFIC element 110 through solder bumps 215, for example, respectively.

Figure 16:
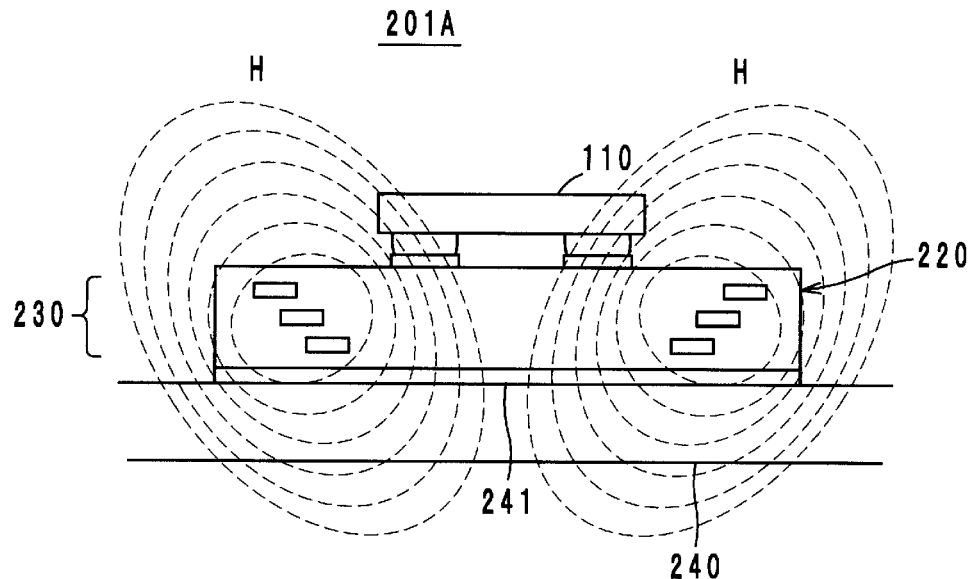
FIG. 16 is an explanatory diagram illustrating a magnetic field radiation state of the RFID tag illustrated in FIG. 15.

As illustrated in FIG. 15, the RFID tag 201A is preferably attached to a base material 240, such as a printed wiring substrate or other suitable material, for example, with an adhesive layer 241. As illustrated in FIG. 16, the coil antenna 230 is arranged so that the spread of a magnetic field H radiated from the antenna 230 varies depending on the top surface side and the bottom surface side of the power feeding substrate 220. Specifically, the coil antenna 230 is preferably arranged so that the opening sizes (meaning the internal diameters of individual patterns in the present application) of the conductor patterns 233a, 233b, and 233c for a coil substantially increase in a direction from the bottom surface side of the power feeding substrate 220 to the top surface side thereof.

The RFID tag 201A is capable of communicating with a reader/writer in an RFID system, not illustrated, and the RFID tag 201A and the reader/writing define an information processing system. In this information processing system, by arranging the antenna of the reader/writer adjacent to the RFID tag 201A, a magnetic flux based on a signal of a predetermined frequency (for example, a UHF band or an HF band) radiated from the antenna penetrates the coil antenna 230, and thus, a current flows in the antenna 230. This current is supplied to the RFIC element 110, thereby causing the RFIC element 110 to operate. On the other hand, a response signal from the RFIC element 110 is radiated, as a magnetic field, from the coil antenna 230, and read by the reader/writer.

A magnetic field H radiated from the coil antenna 230 is indicated by dotted lines in FIG. 16. Since this coil antenna 230 is embedded in the power feeding substrate 220, and the magnetic field H generated in the coil antenna 230 spreads beyond the RFID tag 201A. Accordingly, the degree of freedom of a positional relationship with the antenna of the reader/writer, not illustrated, is increased, and it is possible to stably establish communication over a wide range.

In addition, while communication between the reader/writer and the RFID tag 201A is established primarily by a magnetic field, since the attenuation of the magnetic field with respect to a distance is greater than that of an electric field, communication is established in a relatively close state. Therefore, it is possible to establish communication with only the RFID tag to be a target to be read for the reader/writer, and there is little possibility that communication is erroneously established with a neighboring RFID tag that is not a target to be read.

It is preferable that the imaginary portion of the impedance of the RFIC element 110 and the imaginary portion of the impedance of the coil antenna 230 have a conjugate relationship with each other at the frequency of a signal used for communication. Particularly, it is preferable that the resonance frequency of the coil antenna 230 is located near the operation frequency. It is further preferable that the real portions of the impedances coincide or substantially coincide with each other.

In particular, when the coil antenna 230 is a lamination type coil antenna and has a relatively large aperture portion, it is possible to obtain a large inductance value with a relatively small coil antenna, and furthermore, the overall size of the RFID tag 201A can be reduced. By setting the operation frequency to a short wavelength in the vicinity of about 950 MHz, the size of the RFID tag 201A can be further reduced. When the frequency of a UHF band is used for communication, the RFID tag 201A may preferably have a size of about 3.2 mm long, about 1.6 mm wide, and about 0.5 mm tall, for example.

Here, an example of the laminated structure of the power feeding substrate 220 (coil antenna 230) will be described with reference to FIG. 17. This power feeding substrate 220 is obtained by providing and laminating electrodes, conductors, and via hole conductors in a plurality of sheets 221a to 221e whose main constituent is a dielectric material or a magnetic material, for example.

Preferably, electrodes 231a and 231b, to be connected to input-output terminal electrodes of the RFIC element 110, not illustrated, and mounting electrodes 231c and 231d (to be connected to mounting terminal electrodes of the RFIC element 110, not illustrated) are provided in the sheet 221a of the first layer, connecting conductors 232a and 232b are provided in the sheet 221b of the second layer, and conductor patterns 233a, 233b, and 233c for a coil are provided in the sheets 221c to 221e of the third layer to the fifth layer.

The conductor patterns 233a, 233b, and 233c for a coil are connected in a coil shape through via hole conductors 234a, thereby defining the antenna 230. One end of the conductor pattern 233a is connected to the electrode 231a through a via hole conductor 234b, the connecting conductor 232a, and a via hole conductor 234c. In addition, one end of the conductor pattern 233c is connected to the electrode 231b through a via hole conductor 234d, the connecting conductor 232b, and a via hole conductor 234e.

When a lamination type antenna coil is used for the coil antenna 230, it is possible to achieve stable operation in addition to an enlarged aperture portion. Particularly, since capacitance between the conductor patterns 233a, 233b, and 233c for a coil is dependent on the quality of material therebetween (the quality of the material of the sheet), the influence of the electric permittivity of the attachment target article of the RFID tag 201A is reduced (the fluctuation of stray capacitance is less likely to occur), and the change of the inductance value of the coil is minimized. Therefore, a change of the resonance frequency is minimized, and the communication distance is ensured. In particular, by using material having a high electric permittivity for the power feeding substrate 220, the impedance of the coil within the power feeding substrate 220 is effectively determined, and is not significantly influenced by a usage environment.

In addition, the conductor patterns 233a, 233b, and 233c for a coil in each coil antenna 230 may preferably be configured using a greater number of conductor patterns. In addition, it is only necessary for the opening size of each pattern to be configured so as to substantially increase in a direction from the bottom surface side of the power feeding substrate 220 to the top surface side thereof. It is not necessary for the term "substantially" to mean that the opening size continuously increases in a step-by-step manner, and a conductor pattern for a coil, located midway, may also have the same opening size as those of patterns located above and below the conductor pattern or alternatively, the conductor pattern for a coil may also have an opening size larger than that of a pattern located below the conductor pattern. In addition, in a preferred embodiment of the present invention described below, it is also not necessary for the opening size of each pattern to continuously increases in a step-by-step manner in a vertical direction.

Fifth Example of RFID Tag

Figure 18:
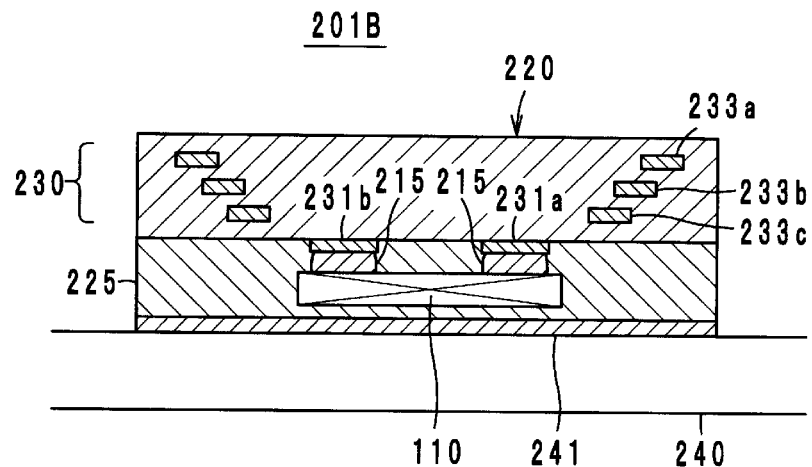
FIG. 18 is a cross-sectional view illustrating an RFID tag according to a fifth example of a preferred embodiment of the present invention.

As illustrated in FIG. 18, an RFID tag 201B according to a fifth example of a preferred embodiment of the present invention is preferably obtained by mounting the RFIC element 110 on the back surface side of the power feeding substrate 220 in which the coil antenna 230 is embedded and providing a sealing layer 225 arranged to cover the RFIC element 110. The upper surface of the sealing layer 225 is attached to the base material 240 such as a printed wiring substrate or other suitable material, for example, by the adhesive layer 241.

Figure 19:
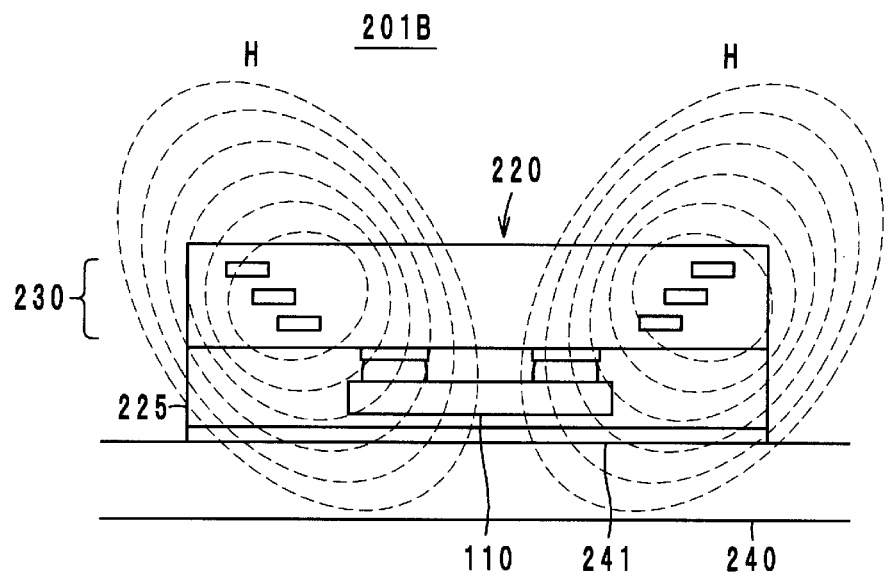
FIG. 19 is an explanatory diagram illustrating a magnetic field radiation state of the RFID tag illustrated in FIG. 18.

The remaining configuration of the fifth example is the same or substantially the same as the fourth example. Accordingly, the functional effect of the fifth example is the same or substantially the same as the fourth example. In particular, by covering the RFIC element 110 using the sealing layer 225, the RFIC element 110 is protected from an external environment. Particularly, the RFIC element 110 is protected from an external mechanical shock. In addition, it is possible to prevent a short circuit caused by moisture or other contaminants, for example, from occurring. Furthermore, the sealing layer 225 is preferably disposed between the power feeding substrate 220 and the base material 240. Therefore, the distance C between the coil antenna 230 and the front surface of the base material 240 is greater than in the fourth example, and the magnetic field H radiated from the coil antenna 230 is arranged so as to be farther away from the base material 240 (refer to FIG. 19). Therefore, it is possible to reduce the influence on the magnetic field H of a metallic substance, such as another mounted component, a wiring pattern, or other metallic substance, for example, provided in the base material 240.

Sixth Example of RFID Tag

Figure 20:
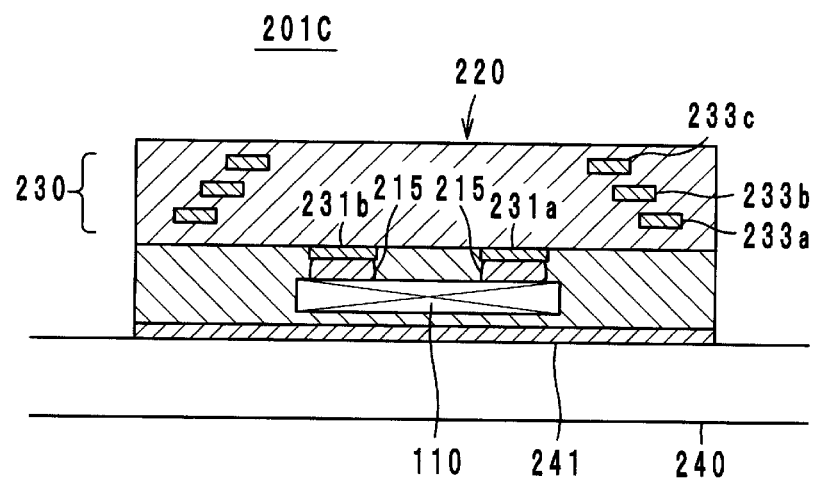
FIG. 20 is a cross-sectional view illustrating an RFID tag according to a sixth example of a preferred embodiment of the present invention.

As illustrated in FIG. 20, an RFID tag 201C according to a sixth example of a preferred embodiment of the present invention is preferably obtained by providing the conductor patterns 233a, 233b, and 233c for a coil, which define the coil antenna 230, so that the opening sizes thereof substantially decrease in a direction from the bottom surface side of the power feeding substrate 220 to the top surface side thereof. In addition, in the same or substantially the same manner as the fourth example, the RFIC element 110 is mounted to the bottom surface of the power feeding substrate 220 and coated by the sealing layer 225.

Figure 21:
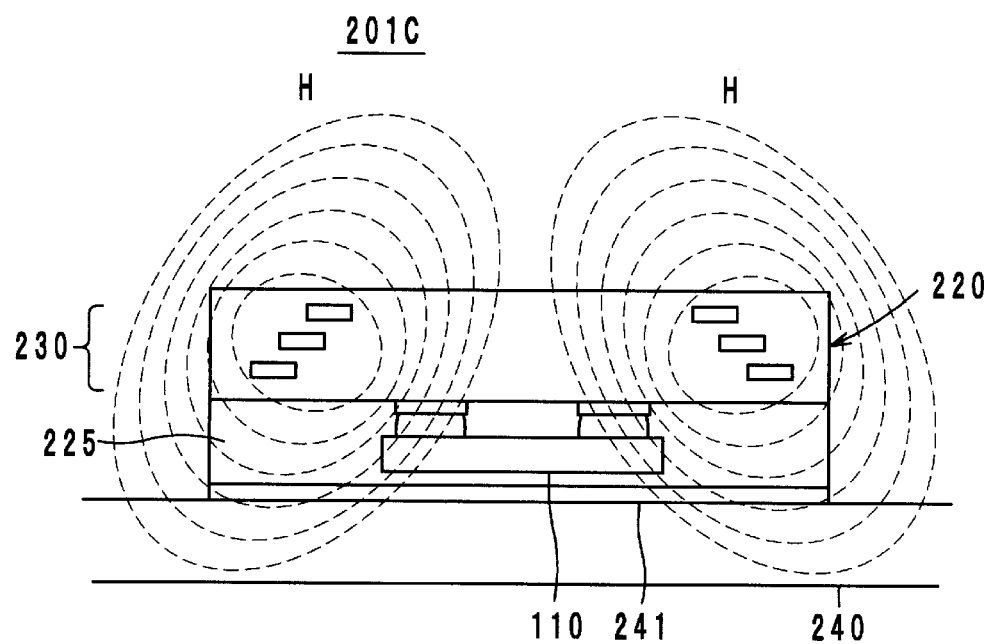
FIG. 21 is an explanatory diagram illustrating a magnetic field radiation state of the RFID tag illustrated in FIG. 20.

The remaining configuration of the sixth example is the same or substantially the same as the fourth example. In the sixth example, since the magnetic field H is radiated from the coil antenna 230 as indicated by dotted lines in FIG. 21, and the opening sizes of the conductor patterns 233a, 233b, and 233c are configured so as to decrease in a direction to the top surface of the power feeding substrate 220, the magnetic field H faces the inward side of the RFID tag 201C, and a region whose magnetic flux density is relatively large is provided in a central portion of the RFID tag 201C, thereby improving a communication characteristic. In addition, the other functional effects of the sixth example are preferably the same or substantially the same as those of the fourth and fifth examples.

Magnetic Field Radiation State in Fifth Example and Sixth Example

Figure 22A:
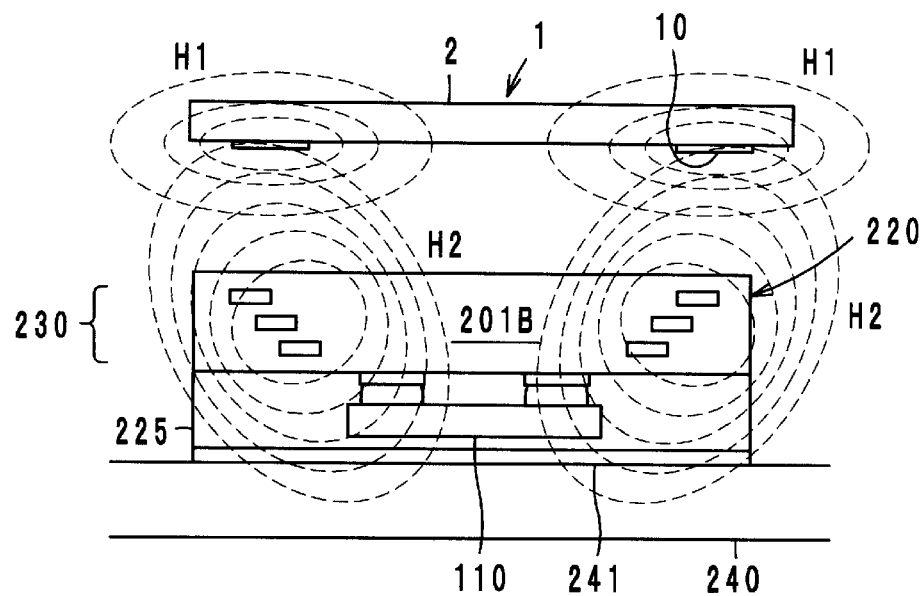
FIG. 22A is an explanatory diagram illustrating a magnetic field radiation state in an RFID system utilizing the RFID tag according to the fifth example.
Figure 22B:
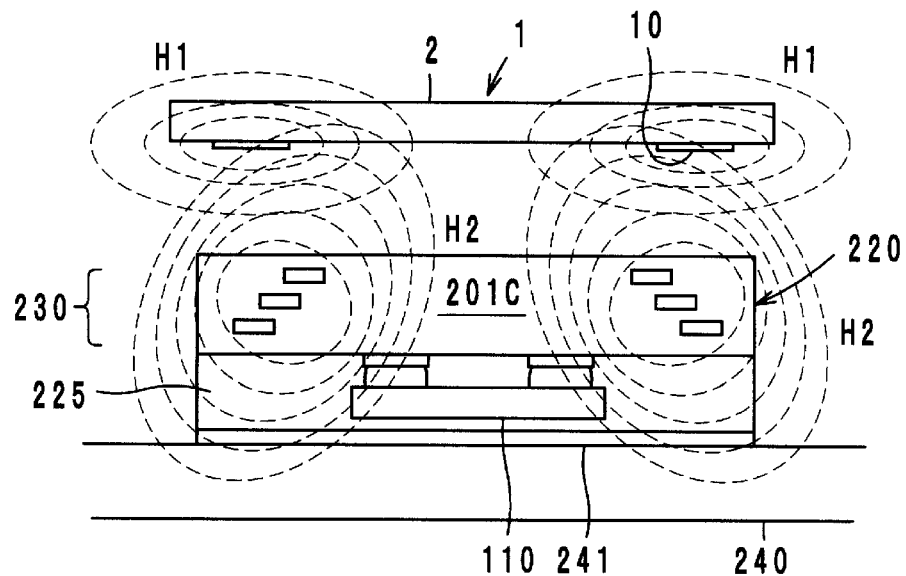
FIG. 22B is an explanatory diagram illustrating a magnetic field radiation state in an RFID system utilizing the RFID tag according to the sixth example of a preferred embodiment of the present invention.

In the RFID system according to preferred embodiments of the present invention, the loop antenna 10 is preferably used as a reader/writer-side antenna, and as an RFID tag-side antenna, for example, the coil antenna 230 is preferably used that is configured so that most of a magnetic field is generated on the reader/writer side. Accordingly, in a state in which the antenna head 1 is arranged to be adjacent to the RFID tags 201B and 201C, as illustrated in FIGS. 22A and 22B, the magnetic field H1 generated from the loop antenna 10 and the magnetic field H2 generated from the coil antenna 230 interlink with each other, a high-frequency signal is mutually transmitted between the loop antenna 10 and the coil antenna 230.

The magnetic field H1 generated from the loop antenna is preferably concentrated in the aperture portion of the loop antenna 10, and widely spread. On the other hand, in the coil antenna 230 in each of the RFID tags 201B and 201C, since most of the magnetic field H2 is generated on the reader/writer side, the magnetic field H2 is preferably concentrated in the aperture portion of the loop antenna 10. Accordingly, even if a metal material is included in or adjacent to the base material 240 or alternatively, the base material 240 is a metal material, communication performance is not deteriorated. Furthermore, by utilizing a high-frequency signal of the UHF band or a frequency band higher than the UHF band, even if the base material 240, on or in which each of the RFID tags 201B and 201C is mounted, is a metal material, the communication performance is not significantly influenced by another mounted component mounted to the base material 240 or metal members, such as various kinds of wiring patterns, for example. In addition, even if the RFID tags 101A, 101B, 201A, 201B, and 201C are used, since, from the coil antennas 130 and 230, most of the magnetic fields are generated on the loop antenna 10 side of the reader/writer, the above-described advantageous effects are achieved.

In addition, when the conductor width of the loop antenna 10 is increased, the magnetic field H1 generated from the loop antenna 10 spreads widely primarily in a direction parallel or substantially parallel to the loop plane thereof, and even if the relative position of the loop antenna 10 with respect to the RFID tags 201B and 201C slightly deviates, the magnetic fields H1 and H2 reliably interlink with each other. Therefore, it is possible to ensure necessary communication performance. Since the magnetic field H2 generated in the coil antenna 230 spreads outward when viewed from the RFID tags 201B and 201C, the degree of freedom of a positional relationship with the loop antenna 10 is significantly increased. In addition, in FIGS. 22A and 22B, the magnetic fields H1 and H2 do not graphically illustrate all of the generated magnetic fields.

In the RFID system according to preferred embodiments of the present invention, the antenna of the reader/writer and the RFID tag are preferably used in a state of being adjacent to each other, and it is possible to establish communication with only a target RFID tag. In this case, it is preferable to configure the coil antenna 230 with an outside dimension thereof being less than or equal to an outside dimension of about 10 mm long and about 10 mm wide and more preferably with a small size of less than or equal to a size of about 5 mm long and 5 about mm wide. Specifically, when it is assumed that an operation frequency band is a UHF band of about 860 MHz to about 960 MHz, the size of each of the RFID tags 201B and 201C is preferably about 3.2 mm long× about 1.6 mm wide, the outside dimension of the coil antenna 230 is preferably about 3.0 mm long× about 4.0 mm wide, the conductor width of the loop antenna 10 is preferably about 0.5 mm, and an output power value preferably is about 1 W, for example, it is possible to establish communication even if a distance between the loop antenna 10 and each of the RFID tags 201B and 201C is about 6 mm. By increasing the output power value or enlarging the size of the coil antenna 230, it is possible to further increase the communication distance.

As described above, preferred embodiments of the present invention are useful for an RFID system in which an RFID tag and a reader/writer establish communication with each other with a distance therebetween of several mm to several cm and in particular, preferred embodiments of the present invention are capable of maintaining a communication distance and superior transmission efficiency of a high-frequency signal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An RFID tag attached to a surface of an article comprising:
   an RFIC chip disposed on a power feeding substrate; and
   a coil antenna provided in the power feeding substrate that includes a plurality of laminated dielectric layers; wherein
   the RFIC chip is provided closer to the surface of the article than the coil antenna;
   the coil antenna is defined by a three-dimensional-shaped coil antenna including a plurality of single loop coil conductors provided in or on different layers of the plurality of laminated dielectric layers;
   the plurality of single loop coil conductors includes a first opening and a second opening defined in the different layers; and
   the second opening is provided closer to the surface of the article than the first opening, and the first opening has greater size to the second opening.

2. The RFID tag according to claim 1, wherein
   the plurality of single loop coil conductors includes a third opening defined in a layer different from the layers in which the first and second openings are defined; and
   the third opening is provided closer to the surface of the article than the second opening, and the second opening has greater size to the third opening.

3. An RFID system comprising:
   a handheld reader/writer including an antenna; and
   an RFID tag including an antenna attached to an article; wherein
   transmission and/or reception of a high-frequency signal in a UHF band or an SHF band is performed between the antenna of the handheld reader/writer and the antenna of the RFID tag;
   the antenna of the handheld reader/writer is defined by an approximately one-turn loop antenna;
   the RFID tag includes:
      an RFIC chip disposed on a power feeding substrate; and
      a coil antenna provided in the power feeding substrate that includes a plurality of laminated dielectric layers; wherein
      the RFIC chip is provided closer to a surface of the article than the coil antenna;
      the coil antenna of the RFID tag is defined by a three-dimensional-shaped coil antenna including a plurality of single loop coil conductors provided in or on different layers of the plurality of laminated dielectric layers;
      the plurality of single loop coil conductors includes a first opening and a second opening defined in the different layers; and
      the second opening is provided closer to the surface of the article than the first opening, and the first opening has greater size to the second opening.

4. The RFID system according to claim 3, wherein
   the one-turn loop antenna includes a loop conductor; and
   a conductor width of the loop conductor is greater than a conductor width of the single loop coil conductors.

5. The RFID system according to claim 3, wherein an area occupied by the one-turn loop antenna of the handheld reader/writer is 1 to 6 times as large as an area occupied by the coil antenna of the RFID tag, in planar view.

6. The RFID system according to claim 3, wherein
   the power feeding substrate includes a ceramic laminated body; and
   each of the plurality of laminated dielectric layers is a ceramic dielectric layer.

7. The RFID system according to claim 3, wherein the handheld reader/writer includes a gripper connected to the one-turn loop antenna.

8. The RFID system according to claim 3, wherein the one-turn loop antenna is disposed within a plane.

9. The RFID system according to claim 3, wherein
   the plurality of single loop coil conductors includes a third opening defined in a layer different from the layers in which the first and second openings are defined; and
   the third opening is provided closer to the surface of the article than the second opening, and the second opening has greater size to the third opening.

* * * * *